US008471633B2

(12) United States Patent
Tsuchi et al.

(10) Patent No.: US 8,471,633 B2
(45) Date of Patent: Jun. 25, 2013

(54) DIFFERENTIAL AMPLIFIER AND DATA DRIVER

(75) Inventors: Hiroshi Tsuchi, Kanagawa (JP); Sensuke Kimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/297,639

(22) Filed: Nov. 16, 2011

(65) Prior Publication Data

US 2012/0133438 A1 May 31, 2012

(30) Foreign Application Priority Data

Nov. 29, 2010 (JP) ................................ 2010-265075

(51) Int. Cl.
*H03F 3/45* (2006.01)
(52) U.S. Cl.
USPC ............................ 330/255; 330/257; 330/260
(58) Field of Classification Search
USPC .......................... 330/253, 255, 257, 260, 261
See application file for complete search history.

(56) References Cited

U.S. PATENT DOCUMENTS

| 5,311,145 | A | 5/1994 | Huijsing et al. |
| 6,373,419 | B1 | 4/2002 | Nakao |
| 7,116,171 | B2 * | 10/2006 | Maekawa et al. ............ 330/253 |
| 7,342,449 | B2 * | 3/2008 | Ishii et al. ..................... 330/253 |
| 7,425,867 | B2 * | 9/2008 | Aemireddy et al. .......... 330/257 |
| 7,432,922 | B2 * | 10/2008 | Chang et al. .................. 345/212 |

FOREIGN PATENT DOCUMENTS

| JP | 6-326529 | 11/1994 |
| JP | 2000-183747 | 6/2000 |
| JP | 2006-50296 | 2/2006 |

* cited by examiner

*Primary Examiner* — Khanh V Nguyen
(74) *Attorney, Agent, or Firm* — Young & Thompson

(57) ABSTRACT

A differential amplifier has an interpolating function and has: first and second differential pairs including transistors of a first conductivity type; third and fourth differential pairs including transistors of a second conductivity type; first and second current sources providing operating currents to the first and second differential pairs; third and fourth current sources providing operating currents to the third and fourth differential pairs; a first control circuit which controls, in a first operating range where the amounts of currents flowing through the first and second differential pairs become smaller, respectively, a changing point at which the operating current of the first differential pair changes; and a second control circuit which controls, in a second operating range where the amounts of currents flowing through the third and fourth differential pairs become smaller, respectively, a changing point at which the operating current of the fourth differential pair changes.

13 Claims, 14 Drawing Sheets

DIFFERENTIAL AMPLIFIER AND DATA DRIVER

CROSS-REFERENCE TO RELATED APPLICATIONS

The disclosure of Japanese Patent Application No. 2010-265075 filed on Nov. 29, 2010 including the specification, drawings and abstract is incorporated herein by reference in its entirety.

BACKGROUND

The present invention relates to a differential amplifier and a data driver and, more particularly, to a differential amplifier having an interpolation function for outputting an intermediate voltage between two input voltages and a data driver having plural such differential amplifiers.

In recent years, many thin display devices such as liquid crystal display devices and organic light emitting diode (OLED) display devices have been introduced in the market. An active-matrix driving method is among the driving methods used for such display devices. Generally, a thin display device using an active-matrix driving method includes a display panel which has scanning lines and data lines arranged in a grid pattern with a pixel having a pixel switch (thin-film transistor) and a display element section provided at each of the scanning line and data line intersections, a gate driver which outputs a scanning signal for turning on/off the pixel switch of each pixel to each scanning line, and a data driver which outputs a gradation voltage signal corresponding to video data to each data line. In such a display device, when the pixel switches are turned on by scanning signals, the gradation voltage signals inputted to the respective data lines are applied to the display element sections causing the display element sections to change their brightness according to the gradation voltage signals so as to realize image display on the display device.

In a liquid crystal display device, a display panel includes two substrates with liquid crystals sealed therebetween and, in the display element section of each pixel, the liquid crystal transmittance is controlled according to a gradation voltage signal received via the pixel switch so as to change display brightness. A backlight is provided as a light source behind the display panel. In an OLED (Organic Light Emitting Diode) display device, a display panel includes pixels each provided with an OLED as a display element and a current control element (thin-film transistor) for controlling the drive current for the OLED. In the display element section of each pixel, the drive current for driving the OLED is controlled according to the gradation voltage signal applied via the pixel switch causing the OLED to emit light according to the drive current so as to change the brightness of the OLED. Even though there are OLED display devices in which the drive currents for OLEDs are supplied directly to the data lines, the present invention is limited to a configuration in which gradation voltage signals are supplied to the data lines.

In the above display device, one screen portion of data is rewritten in one frame period (normally, about 0.017 second based on 60-Hz driving). The scanning lines select the pixel lines sequentially one by one (by turning the pixel switches along the pixel line on). During the period of time a pixel line is selected, the display element section of each pixel along the selected pixel line is provided with a gradation voltage signal from the corresponding data line via the corresponding pixel switch. The period of time during which a pixel line is selected approximately equals one frame period divided by the number of scanning lines. Every time a pixel line is selected, the data driver outputs gradation voltage signals corresponding to video data to the respective data lines. In the following, a data driver for driving an active matrix display device and differential amplifiers used in the output circuit of a data driver will be described.

The data driver generates reference voltages corresponding to gradation characteristics by dividing, using resistors, a γ voltage applied from outside and selects, using a D/A converter, a reference voltage corresponding to digital input video data. The selected reference voltage is inputted to a differential amplifier (hereinafter also referred to as an "output amplifier") of a voltage follower. The data driver is provided with plural D/A converters and differential amplifiers (output amplifiers) corresponding to the number of data lines of the display panel and outputs a gradation voltage signal corresponding to video data to each data line of the display panel.

In recent years, display devices for TVs and personal computers have been growing larger in screen size and higher in definition. As a result, the load capacity of data lines of each display device has increased requiring the data driver to be capable of driving larger loads (data lines) at higher speed. As for color display, the number of colors (gradation levels) has been increasing promoting transition from 260,000-color display using 6-bit, RGB digital video data to 8-bit, 16,700,000-color display and further to 10-bit, 1,000,000,000-color display.

The increases in the number of bits per color for each pixel cause the number of gradation voltage levels outputted from a data driver to increase correspondingly, namely, from 64 gradation levels for 6 bits/color to 256 gradation levels for 8 bits/color and further to 1024 gradation levels for 10 bits/color. When the number of gradation levels increases, the minimum value between gradation voltages decreases. Hence, the output amplifiers to be used are required to offer improved output voltage accuracy and meet severer characteristic specifications, for example, concerning output deviations.

A data driver compatible with video data using an increased number of bits per color includes larger D/A converter circuits (including more elements) used to select a reference voltage for each pixel out of plural reference voltages corresponding to the number of gradation levels. This is a factor in increasing the chip area of each data driver LSI. Using an amplifier having an interpolation function (hereinafter also referred to as an "interpolating amplifier") as means of suppressing expansion of the scale of D/A converter circuits is disclosed in Japanese Patent Laid-Open No. 2006-050296.

FIG. 9 is a block diagram of a data driver 100 disclosed in Japanese Patent Laid-Open No. 2006-050296. As shown in FIG. 9, the data driver 100 includes a latch address selector 181, a latch 182, a reference voltage generation circuit 186, decoders (for example, D/A converters) 187, and output amplifiers 188. In the data driver 100, the output amplifiers 188 are interpolating amplifiers. Each output amplifier 188 interpolates input voltages Vin1 and Vin2 at a ratio of 1:1. Namely, when input voltages Vin1 and Vin2 are equal, the output amplifier 188 outputs input voltage Vin1 (or input voltage Vin2) as output voltage Vout. When input voltages Vin1 and Vin2 are not equal, the output amplifier 188 outputs an intermediate voltage between the input voltages Vin1 and Vin2 as an output voltage. With the output amplifier having an interpolating function provided, the decoder 187 can have a configuration in which, out of reference voltages (V0, V2, V4, . . . , V2n) corresponding to every second gradation voltage, two same reference voltages or two adjacent reference voltages are selected according to video data. Since this can approximately halve the number of reference voltages selected by the decoder 187, the circuit scale (number of elements) of the decoder 187 can be reduced.

FIG. 10 shows a circuit diagram of the output amplifier 188 having an interpolating function. The basic configuration of the output amplifier 188 shown in FIG. 10 is based on a configuration disclosed in Japanese Patent Laid-Open No. Hei 06 (1994)-326529 (i.e. configuration shown in FIG. 1 of Japanese Patent Laid-Open No. Hei 06 (1994)-326529 applied to a feedback amplifier). The output amplifier 188 has a differential input section 210 and an output amplification section 211. The differential input section 210 has two n-channel differential pairs each including NMOS transistors and two p-channel differential pairs each including PMOS transistors. The output amplification section 211 has low-voltage cascode current mirrors 250 and 280, connection stages (floating current sources) 260 and 270, and output transistors 291 and 292.

The low-voltage cascode current mirror 250 includes PMOS transistors 251 to 254 and receives the differential current outputs of the two n-channel differential pairs having commonly coupled output pairs. The low-voltage cascode current mirror 280 includes NMOS transistors 281 to 284 and receives the differential current outputs of the two p-channel differential pairs having commonly coupled output pairs. The connection stage 260 couples the output of the low-voltage cascode current mirror 250 (drain of the PMOS transistor 254) and the output of the low-voltage cascode current mirror 280 (drain of the NMOS transistor 284). The connection stage 270 couples the input to the low-voltage cascode current mirror 250 (drain of the PMOS transistor 253) and the input to the low-voltage cascode current mirror 280 (drain of the NMOS transistor 283). The output transistor 291 is a PMOS transistor whose drain is coupled to an output terminal, whose gate is coupled to a coupling node between the output of the low-voltage cascode current mirror 250 and the connection stage 260, and whose source is coupled to power supply VDD on the high potential side. The output transistor 292 is an NMOS transistor whose drain is coupled to the output terminal, whose gate is coupled to a coupling node between the output of the low-voltage cascode current mirror 280 and the connection stage 260, and whose source is coupled to power supply VSS on the low potential side. The output amplifier 188 with its differential input section 210 having n-channel differential pairs and p-channel differential pairs makes up a rail-to-rail amplifier and the voltages inputted thereto are close to the supply voltages. In cases where either the n-channel differential pairs or the p-channel differential pairs stop operating, the other differential pairs operate enabling output amplification to be continued in a voltage range identical to the supply voltage range.

The differential input section 210 of the output amplifier 188 shown in FIG. 10 includes two n-channel differential pairs ((221, 2221 and (223, 224)) and two p-channel differential pairs ((225, 226) and (227, 228)). The four differential pairs are driven by as many current sources (231, 232, 233, and 234), respectively. The first n-channel differential pair (221, 222) and the first p-channel differential pair (225, 226) have input voltage Vin1 inputted to their first input terminals (gates of the transistors 221 and 225), respectively, out of their input pairs and have output voltage Vout inputted to their second input terminals (gates of the transistors 222 and 226), respectively, out of their input pairs. The second n-channel differential pair (223, 224) and the second p-channel differential pair (227, 228) have input voltage Vin2 inputted to their first input terminals (gates of the transistors 223 and 227), respectively, out of their input pairs and have output voltage Vout inputted to their second input terminals (gates of the transistors 224 and 228), respectively, out of their input pairs. The output pairs of the n-channel differential pairs (221, 222) and (223, 224) are commonly coupled. One, N201, of the output pair nodes is coupled to the output side node (coupling node between the PMOS transistors 252 and 254) of the current mirror 250. The other, N202, of the output pair nodes is coupled to the input side node (coupling node between the PMOS transistors 251 and 253) of the current mirror 250. The output pairs of the p-channel differential pairs (225, 226) and (227, 228) are also commonly coupled. One, N203, of the output pair nodes is coupled to the output side node (coupling node between the NMOS transistors 282 and 284) of the current mirror 280. The other, N204, of the output pair nodes is coupled to the input side node (coupling node between the NMOS transistors 281 and 283) of the current mirror 280.

Now, description will be focused on the n-channel differential pairs (221, 222) and (223, 224). When it is assumed that the transistors making up the n-channel differential pairs are equally sized, the drain currents I (221), I (222), I (223), and I (224) are given by the following equations.

$$I(221) = (\beta/2)(Vin1 - Vs1 - VTH))^2 \quad (1)$$

$$I(222) = (\beta/2)(Vout - Vs1 - VTH))^2 \quad (2)$$

$$I(223) = (\beta/2)(Vin2 - Vs2 - VTH))^2 \quad (3)$$

$$I(224) = (\beta/2)(Vout - Vs2 - VTH))^2 \quad (4)$$

where $\beta$ is a gain factor given by ($\beta = \mu(W/L)(\in x/tox)$ where $\mu$ is the effective mobility of electrons, $\in x$ is the dielectric constant of the gate insulating film, tox is the film thickness of the gate insulating film, W is the channel width, and L is the channel length), VTH is a threshold voltage, and Vs1 and Vs2 are the common source voltages of the differential pairs (221, 222) and (223 and 224), respectively.

The output current (I (221)+I (223)) of one, N201, of the common output pair nodes of the n-channel differential pairs (221, 222) and (223, 224) is coupled to the output current of the current mirror 250 via the output side node (coupling node between the PMOS transistors 252 and 254) of the current mirror 250. The output current (I (222)+I (224)) of the other, N202, of the common output pair nodes of the n-channel differential pairs (221, 222) and (223, 224) is coupled to the input current to the current mirror 250 via the input side node (coupling node between the PMOS transistors 251 and 253) of the current mirror 250. The output amplifier 188 controls the output voltage Vout so as to equalize the input current to and the output current from current mirror 250. Namely, the drain currents I (221) to I (224) are related as expressed as follows.

$$I(221) + I(223) = I(222) + I(224) \quad (5)$$

The output currents of the current sources 231 and 232 for driving the n-channel differential pairs (221, 222) and (223, 224) are equalized. This causes the drain currents I (221) to I (224) to be related as follows.

$$I(221) + I(222) = I(223) + I(224) \quad (6)$$

Then, equations (7) and (8) are obtained from equations (5) and (6).

$$I(221) = I(224) \quad (7)$$

$$I(222) = I(223) \quad (8)$$

Assigning equations (1) to (4) into equations (7) and (8) thereby eliminating Vs1 and Vs2 generates equation (9).

$$Vout=(Vin1+Vin2)/2 \quad (9)$$

By making similar calculations also for the p-channel differential pairs (225, 226) and (227, 228), an equation similar to equation (9) can be obtained. Namely, the output amplifier 188 shown in FIG. 10 can, by being provided with the two input voltages Vin1 and Vin2, output an intermediate voltage between the two input voltages (interpolated voltage). This input/output voltage characteristic of an interpolating amplifier is also disclosed in, for example, Japanese Patent Laid-Open No. 2000-183747.

For the data driver 100, an expansion of the circuit scale of decoders (for example, D/A converters) for processing multi-bit video data can be suppressed by using the output amplifier 188 shown in FIG. 10. It is, however, pointed out in Japanese Patent Laid-Open No. 2006-050296 that the output voltage error enlarges in certain voltage ranges near either of the supply voltages. The graph shown in FIG. 11 is used in Japanese Patent Laid-Open No. 2006-050296 in describing the above problem. The graph shown in FIG. 11 shows steady-state characteristics of output voltage setting (expected output voltage) versus output voltage error with the two input voltages Vin1 and Vin2 (Vin1>Vin2) of the output amplifier 188 differing from each other by 0.2 V. Referring to FIG. 11, in an expected output voltage range of about 0.5 V to 2V on the low potential supply voltage side, the output voltage error enlarges in the positive direction and, in an expected output voltage range of about 13 V to 14.5 V on the high potential supply voltage side, the output voltage error enlarges in the negative direction. Such an increase in output voltage error occurring when the expected output voltage is near a supply voltage is caused, for example, in cases where the two input voltages Vin1 and Vin2 lower when the expected output voltage is near the supply voltage on the low potential side causing the n-channel differential pairs provided with the low-potential input voltage Vin2 to stop first and the n-channel differential pairs provided with the high potential input voltage Vin1 to stop next. What causes the increase in output voltage error is breakdown of the relationship, expressed by the above equations (1) to (8), between the n-channel differential pairs. The relationship breakdown results when, in the process leading to stopping of the n-channel differential pairs, the gate-source voltage in each transistor included in each differential pair lowers to decrease the drain-to-source current. Note that, when the two n-channel differential pairs both stop, only the two p-channel differential pairs function. This decreases the output voltage error and puts the output voltage into a normal state. When the two input voltages Vin1 and Vin2 rise with the expected output voltage being near the supply voltage on the high potential side, causing the p-channel differential pair provided with the high-potential input voltage Vin1 to stop first and the p-channel differential pair provided with the low-potential input voltage Vin2 to stop next, the output voltage error increases.

The output voltage error occurring when the expected output voltage is near a supply voltage increases more when the difference between the input voltages Vin1 and Vin2 is larger. Thus, an interpolating amplifier like the one shown in FIG. 10 has a problem that, in an expected output voltage range near a supply voltage where the output voltage error increases, the interpolating amplifier cannot provide an output voltage with high accuracy.

The mechanism by which, according to analysis made by the inventors of the present invention, the output voltage error of the output amplifier 188 shown in FIG. 10 increases will be described below. FIG. 12 shows graphs representing steady-state characteristics of output voltage setting (expected output voltage) versus output voltage error prepared for use in explaining the mechanism by which the output voltage error of the output amplifier 188 shown in FIG. 10 increases. The operation example shown in FIG. 12 is based on the settings of the output amplifier 188 in which the input voltage Vin1 is higher by ΔV than the input voltage Vin2 (Vin1−Vin2=ΔV where ΔV>0) and in which the output voltage setting equals an intermediate voltage between the input voltages Vin1 and Vin2 ((Vin1+Vin2)/2).

When, in the interpolating amplifier shown in FIG. 10, interpolation is normally performed, the n-channel differential pairs (221, 222) and (223, 224) are related as expressed by, the above equations (7) and (8). When the input voltage Vin1 is higher than the input voltage Vin2, the currents I (221) and I (224) are larger than the currents I (222) and I (223). In the present operation example, the currents I (221) to I (224) are related as follows: I (221)=I (224)=In2; and I (222)=I (223)=In1; where In2>In1. The total current (In1+In2) corresponds to the current values outputted from the current sources 231 and 232 (outputting equal currents). The p-channel differential pairs (225, 226) and (227, 228) are similarly related. Namely, when interpolation is normally performed with the input voltage Vin1 being higher than the input voltage Vin2, the currents I (227) and I (226) are larger than the currents I (225) and I (228), and the currents I (225) to I (228) are related as follows: I (227)=I (226)=Ip2; and I (225)=I (228)=Ip1; where Ip2>Ip1. The total current (Ip1+Ip2) corresponds to the current values outputted from the current sources 233 and 234 (outputting equal currents). The current values in the p-channel differential pairs are represented by absolute values of their drain-to-source currents.

In FIG. 12, part (1) represents the current characteristics of transistors 111 to 114 included in the n-channel differential pairs (221, 222) and (223, 224). In part (1), currents I (221) and I (222) are represented by solid lines and currents I (223) and I (224) are represented by broken lines. When the output voltage setting is in a range near the high potential supply voltage VDD, the currents flowing through the transistors included in the n-channel differential pairs are kept constant, namely, I (221)=I (224)=In2 and I (222)=I (223)=In1. In this state, interpolation is performed normally. When, with the output Voltage setting being in a range near the low potential supply voltage VSS, the input voltages Vin1 and Vin2 lower causing the output voltage setting to reach Vd, first the common source terminal of the n-channel differential pair (223, 224) provided with the low potential input voltage Vin2 reaches the low potential supply voltage VSS. When the output voltage setting further lowers, with the common source terminal voltage of the n-channel differential pair (223, 224) being unable to drop below the low potential supply voltage VSS, only the input voltage for the differential pair (223, 224) lowers (i.e. gate-source voltages of the transistors 223 and 224 lower). Subsequently, as the output voltage setting drops below Vd, the currents I (223) and I (224) start decreasing. When the output voltage setting drops to voltage Vb, the currents I (223) and I (224) become almost zero causing the n-channel differential pair (223, 224) to stop. In the n-channel differential pair (221, 222) provided with the input voltage Vin1, on the other hand, the common source terminal voltage reaches the low potential supply voltage VSS when the output voltage setting drops to voltage Vc. When the output voltage setting further drops, only the input voltage for the n-channel differential pair (221, 222) lowers (gate-source voltages of the transistors 221 and 222 decrease). Subsequently, as the output voltage setting drops below Vc, the currents I (221)

and I (222) start decreasing. When the output voltage setting drops to Va, the currents I (221) and I (222) become almost zero causing the n-channel differential pair (221, 222) to stop. The potential differences between the voltages Va and Vb and between the voltages Vc and Vd depend on ΔV, and the magnitude relationship between the voltages Vb and Vc varies depending on ΔV and the transistor characteristics of the n-channel differential pairs. In the operation example shown in FIG. 12, Vb<Vc.

In FIG. 12, part (2) represents the characteristic (characteristic curve Isn_ref) of the output current difference between the nodes N201 and N202 (I (N201)–I (N202)) of the differential input section 210. The output current I (N201) is the sum of the currents I (221) and I (223) of the n-channel differential pairs, and the output current I (N202) is the sum of the currents I (222) and I (224) of the n-channel differential pairs. The output currents I (N201) and I (N202) are coupled to the currents at the output side node and input side node, respectively, of the current mirror 250 in the output amplification section 211. According to the steady-state characteristics with interpolation being performed normally, the output current difference (I (N201)–I (N202)) is normally zero. In part (2) of FIG. 12, whereas the output current difference (I (N201)–I (N202)) is zero when the output voltage setting is in a range near the high potential supply voltage VDD, the output current difference increases in the positive direction when the output voltage setting is in the range of Vd to Va to be near the low potential supply voltage VSS. The increase in the output current difference (I (N201)–I (N202)) depends on current changes in the n-channel differential pairs. To be concrete, referring to part (1) of FIG. 12, when the output voltage setting drops below voltage Vd, the currents I (223) and I (224) decrease, respectively. At this time, the current I (224) decreases more than the current I (223), whereas the currents I (221) and I (222) do not change. Namely, the output current I (N202) decreases more than the output current I (N201), causing the output current difference (I (N201)–I (N202)) to increase in the positive direction. When the output voltage setting drops below voltage Vc, in addition to the currents I (223) and I (224), the currents I (221) and I (222) also start decreasing. At this time, the current I (221) decreases more than the current I (222). Namely, the output current difference (I (N201)–I (N202)), depending on changes in the currents I (221), I (222), I (223) and I (224), increases in the positive direction when the output voltage setting is in the range of Vd to Vc. The increase peaks when the output voltage setting is in the range of Vc to Vb, starts decreasing when the output voltage setting is in the range of Vb to Va, and returns to zero when the output voltage setting is in the range of Va to VSS.

Referring to part (2) of FIG. 12, an increase in the positive direction in the characteristic (characteristic curve Isn_ref) of the output current difference between the nodes N201 and N202 (I (N201)–I (N202)) in the differential input section 210 affects the output voltage error characteristic (characteristic curve Ve_ref) shown in part (5) of FIG. 12. This is easily known by observing the reactions of the n-channel differential pairs (221,222) and (223, 224) taking place when the input voltages Vin1 and Vin2 for the differential input section 210 change to be higher in potential than the output voltage Vout. When the input voltages Vin1 and Vin2 change to be higher in potential than the output voltage Vout, the currents I (221) and I (223) in the n-channel differential pairs (221, 222) and (223, 224) increase, and the currents I (222) and I (224) decrease. Namely, the output current I (N201) increases and the output current I (N202) decreases. This causes the output amplification section 211 to change the output voltage Vout toward a higher potential. Referring to part (2) of FIG. 12, when the output voltage setting is in the range of voltage Vd to Va, the output current difference (I (N201)–I (N202)) increases in the positive direction. Hence, referring to part (5) of FIG. 12, as the output current difference (I (N201)–I (N202)) increases in the positive direction, the output voltage Vout is affected to change toward a higher potential resulting in generating an output voltage error toward a higher potential (in the positive direction).

In FIG. 12, part (3) represents the current characteristics of transistors 225 to 228 included in the p-channel differential pairs (225, 226) and (227, 228). In part (3) of FIG. 12, the currents I (227) and I (228) are represented by solid lines, and the currents I (225) and I (226) are represented by broken lines. The respective currents represent the drain-to-source currents in absolute value of the corresponding transistors. When the output voltage setting is in a range on the low potential supply voltage VSS side, the currents I (225) and I (228) are kept at Ip1 and the currents I (226) and I (227) are kept at Ip2. In this state, interpolation is performed normally. When, with the output voltage setting being in a range on the high potential supply voltage VDD side, the input voltages Vin1 and Vin2 rise causing the output voltage setting to rise to voltage Ve, first the common source terminal of the p-channel differential pair (225, 226) provided with the high potential input voltage Vin1 reaches the supply voltage VDD. When the output voltage setting further rises, with the common source terminal voltage of the p-channel differential pair (225, 226) being unable to rise above the supply voltage VDD, only the input voltage for the differential pair (225, 226) rises (i.e. gate-source voltages of the transistors 225 and 226 lower in absolute value). Subsequently, as the output voltage setting rises above Ve, the currents I (225) and I (226) start decreasing. When the output voltage setting rises to voltage Vg, the currents I (225) and I (226) become almost zero causing the p-channel differential pair (225, 226) to stop. In the p-channel differential pair (227, 228) provided with the input voltage Vin2, on the other hand, the common source terminal voltage reaches the high potential supply voltage VDD when the output voltage setting rises to voltage Vf. When the output voltage setting further rises, the gate-source voltages of the transistors 227 and 228 included in the p-channel differential pair (227, 228) decrease in absolute value. Subsequently, as the output voltage setting rises above Vf, the currents I (227) and I (228) start decreasing. When the output voltage setting rises to Vh, the currents I (227) and I (228) become almost zero causing the p-channel differential pair (227, 228) to stop.

In FIG. 12, part (4) represents the characteristic (characteristic curve Isp_ref) of the output current difference between the nodes N203 and N204 (I (N203)–I (N204)) of the differential input section 210. The output current I (N203) is the sum of the currents I (225) and I (227) of the p-channel differential pairs, and the output current I (N204) is the sum of the currents I (226) and I (228) of the p-channel differential pairs. The output currents I (N203) and I (N204) are coupled to the currents at the output side node and input side node, respectively, of the current mirror 280 in the output amplification section 211. According to steady-state characteristics with interpolation being performed normally, the output current difference (I (N203)–I (N204)) is normally zero. In part (4) of FIG. 12, whereas the output current difference (I (N203)–I (N204)) is zero when the output voltage setting is in a range near the low potential supply voltage VSS, the output current difference increases in the positive direction when the output voltage setting is in the range of Ve to Vh to be near the high potential supply voltage VDD. The increase in the output current difference (I (N203)–I (N204)) depends on current changes in the p-channel differential pairs. Namely, the output current difference (I (N203)−I (N204)), depending on changes in the currents I (225), I (226), I (227) and I (228) shown in part (3) of FIG. 12, increases in the positive direction when the output voltage setting is in the range of Ve to Vf. The increase peaks when the output voltage setting is in the range of Vf to Vg, starts decreasing when the output voltage setting is in the range of Vg to Vh, and returns to zero when the output voltage setting is in the range of Vh to VDD.

Referring to part (4) of FIG. 12, the characteristic (characteristic curve Isp_ref) of the output current difference between the nodes N203 and N204 (I (N203)−I (N204)) in the differential input section 210 affects the output voltage error characteristic (characteristic curve Ve_ref) shown in part (5) of FIG. 12. This is easily known by observing the reactions of the p-channel differential pairs (225,226) and (227, 228) taking place when the input voltages Vin1 and Vin2 for the differential input section 210 change to be lower in potential than the output voltage Vout. When the input voltages Vin1 and Vin2 change to be lower in potential than the output voltage Vout, the currents I (225) and I (227) in the p-channel differential pairs (225, 226) and (227, 228) increase, and the currents I (226) and I (228) decrease. Namely, the output current difference I (N203) increases and the output current difference I (N204) decreases. This causes the output amplification section 211 to change the output voltage Vout toward a lower potential. Referring to part (4) of FIG. 12, when the output voltage setting is in the range of voltage Ve to Vh, the output current difference (I (N203)−I (N204)) increases in the positive direction. Hence, referring to part (5) of FIG. 12, as the output current difference (I (N203)−I (N204)) increases in the positive direction, the output voltage Vout is affected to change toward a lower potential resulting in generating an output voltage error toward a lower potential (in the negative direction).

The mechanism in which the output voltage error increases in the output amplifier 188 shown in FIG. 10 has been described. As described, when the output voltage setting of the output amplifier 188 shown in FIG. 10 is in a range near a supply voltage, an output voltage error occurs corresponding to increases, based on steady-state characteristics, in the output current difference (I (N201)−I (N202)) on the n-channel differential pair side and in the output current difference (I (N203)−I (N204)) on the p-channel differential pair side. The steady-state characteristic of the output voltage Vout error shown in part (5) of FIG. 12 coincides with the steady-state characteristic of the output voltage error shown in FIG. 11.

In Japanese Patent Laid-Open No. 2006-050296, a technique to suppress the increase in output voltage error is disclosed. FIG. 13 shows a block diagram of an output amplifier 300 disclosed in Japanese Patent Laid-Open No. 2006-050296. The output amplifier 300 shown in FIG. 13 includes an interpolating amplifier 301, a determination section 302, and a differential pair control section 303. The determination section 302 determines whether a target signal, for example, output voltage Vout comes in a voltage range where the output voltage error of the interpolating amplifier increases and outputs a determination signal. The differential pair control section 303 stops differential pair operation when a determination signal indicating that the output voltage Vout is in a voltage range where the output voltage error of the interpolating amplifier increases is received. To be concrete, as shown in FIG. 14, the differential pair control section 303 stops the current sources for driving differential pairs. For example, when the output voltage is in a voltage range which is near a low potential supply voltage and in which the output voltage error increases, the differential pair control section 303 deactivates (stops) the current sources 331 and 332 for driving the two n-channel differential pairs. Also, when the output voltage is in a voltage range which is near a high potential supply voltage and in which the output voltage error increases, the differential pair control section 303 deactivates (stops) the current sources 333 and 334 for driving the two p-channel differential pairs. In this way, when the output voltage is in a range near a supply voltage where the output voltage error increases, the n-channel or p-channel differential pairs are stopped, so that the output voltage error is prevented from increasing.

SUMMARY

The interpolating amplifier disclosed in Japanese Patent Laid-Open No. 2006-050296, however, at least requires as many switches as the number of differential pairs (for example, four switches in the circuit shown in FIG. 14) for use in activating/deactivating the current sources for driving the differential pairs. Furthermore, it also requires a circuit, for example, a comparator circuit to be included in the determination section 302. Thus, the interpolating amplifier to be formed requires many additional elements resulting in expanding the area required for installation.

A differential amplifier according to an aspect of the present invention outputs a voltage (Vout) having a signal level which is between a first input voltage (Vin1) and a second input voltage (Vin2). The differential amplifier includes: a first differential pair (31, 32) including transistors of a first conductivity type and outputting a first pair of differential currents to a first current node pair (N1, N2) based on a difference between a first one of the first and second input voltages and the output voltage (Vout); a second differential pair (33, 34) including transistors of the first conductivity type and outputting a second pair of differential currents to the first current node pair (N1, N2) based on a difference between a second one of the first and second input voltages and the output voltage; a third differential pair (35, 36) including transistors of a second conductivity type and outputting a third pair of differential currents to a second current node pair (N3, N4) based on a difference between the first one of the first and second input voltages and the output voltage; a fourth differential pair (37, 38) including transistors of the second conductivity type and outputting a fourth pair of differential currents to the second current node pair (N3, N4) based on a difference between the second one of the first and second input voltages and the output voltage; a first current source (41) provided between a first power supply for providing a first supply voltage (VSS) and the first differential pair (31, 32) and providing an operating current to the first differential pair; a second current source (42) provided between the first power supply and the second differential pair (33, 34) and providing an operating current to the second differential pair; a third current source (43) provided between a second power supply for providing a second supply voltage (VDD) and the third differential pair (35, 36) and providing an operating current to the third differential pair; a fourth current source (44) provided between the second power supply and the fourth differential pair (37, 38) and providing an operating current to the fourth differential pair; a first control circuit (51) which controls, in a first operating range, a changing point at which the operating current provided to the first differential pair changes, the first operating range being where the amounts of currents flowing, based on the first and second input voltages and the output voltage, through the first differential pair (31, 32) and second differential pair (33, 34), respectively, become smaller than current amounts set by the first current source (41) and second current source (42), respectively; a second control circuit (52) which controls, in a second operating range, a changing point at which the operating current provided to one of the third and fourth differential pairs changes, the second operating range being where the amounts of currents flowing, based on the first and second input voltages and the output voltage, through the third differential pair (35, 36) and fourth differential pair (37, 38), respectively, become smaller than current amounts set by the third current source (43) and fourth current source (44), respectively; and an output amplification section (11) which generates the output voltage (Vout) based on a differential current output generated by combining the first and second pairs of differential currents outputted from the first current node pair (N1, N2) and a differential current output generated by combining the third and fourth pairs of differential currents outputted from the second current node pair (N3, N4).

In the differential amplifier according to another aspect of the present invention in which an output voltage error is caused by current differences between the differential currents outputted from the first output node pair and between the differential currents outputted from the second output node pair, first and second control circuits suppress increases in such current differences. This control is performed in first and second operating ranges where the output voltage error increases. Namely, in the differential amplifier according to the present invention, the first and second control circuits control, in the first and second operating ranges, a changing point at which the operating current supplied from a current source to the differential pair provided with whichever of the first and second input voltages differs, by a larger margin than the other input voltage does, from the corresponding supply voltage and thereby suppress increases in the current differences between the differential currents outputted from the first output node pair and between the differential currents outputted from the second output node pair. This makes it possible to prevent the output voltage error from increasing. Also, since the first and second control circuits of the differential amplifier according to the present invention can be configured using simple circuits with fewer elements, the area requirement for the differential amplifier is reduced.

The differential amplifier according to the aspects of the present invention makes it possible to prevent the output voltage error from increasing while suppressing circuit scale expansion.

DETAILED DESCRIPTION

First Embodiment

A first embodiment of the present invention will be described below with reference to drawings. The differential amplifier of the first embodiment is an interpolating amplifier which outputs an interpolated voltage obtained by interpolating two input voltages at a ratio of 1:1. Namely, the differential amplifier of the present embodiment can, when included, for example, in a data driver, decrease the number of elements required, for example, for a D/A converter.

Figure 1:
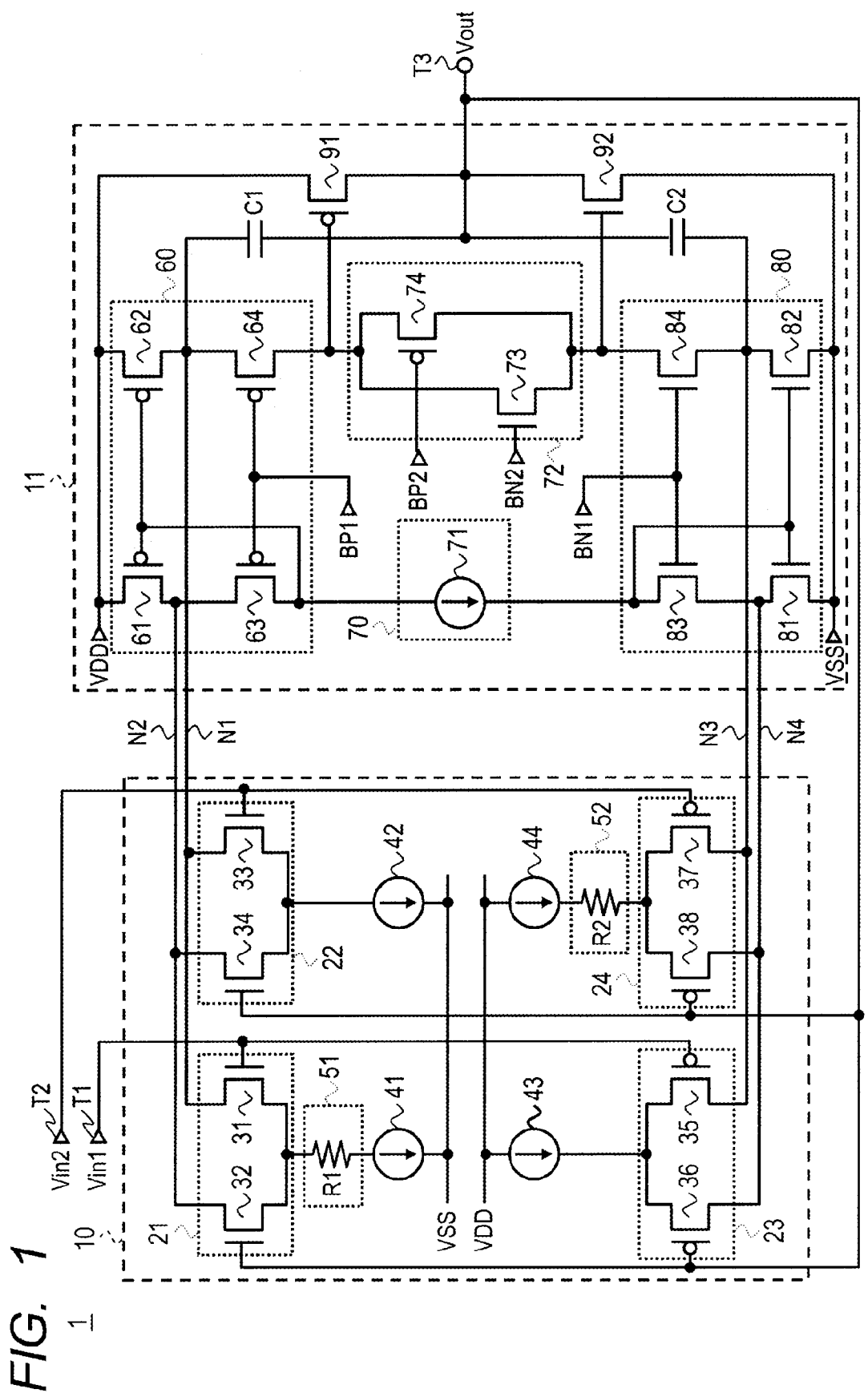
FIG. 1 is a circuit diagram of a differential amplifier according to a first embodiment of the present invention.

FIG. 1 shows a circuit diagram of a differential amplifier 1 according to the present embodiment. As shown in FIG. 1, the differential amplifier 1 has a differential input section 10 and an output amplification section 11. The differential input section 10 outputs differential currents based on the differences between two input voltages Vin1 and Vin2 supplied to input terminals T1 and T2 and output voltage Vout outputted from output terminal T3. The output amplification section 11 generates the output voltage Vout corresponding to the differential current output. The differential amplifier 1 has a negative feedback configuration for feeding back the output voltage Vout generated by the output amplification section 11 to the differential input section 10. The input voltages Vin1 and Vin2 inputted to the differential amplifier 1 are related such that either the input voltage Vin1 is higher than the input voltage Vin2 or the input voltages Vin1 and Vin2 are equal.

The differential input section 10 has first to fourth differential pairs 21 to 24, first to fourth current sources 41 to 44, and first and second control circuits 51 and 52. The first to fourth differential pairs 21 to 24 can be provided with whichever of the input voltages Vin1 and Vin2 is desired. The following description is, however, based on the assumption that the input voltage Vin1 is inputted to the first and third differential pairs 21 and 23 and that the input voltage Vin2 is inputted to the second and fourth differential pairs 22 and 24.

The first differential pair 21 outputs a first pair of differential currents to a first current node pair based on the difference between the input voltage Vin1 and the output voltage Vout. In FIG. 1, the first current node pair includes current nodes N1 and N2. The first differential pair 21 includes transistors of a first conductivity type (for example, N-type MOS transistors). In the example shown in FIG. 1, the first differential pair 21 includes a first differential input transistor (for example, an NMOS transistor 31) and a second differential input transistor (for example, an NMOS transistor 32). First terminals (for example, sources) of the NMOS transistors 31 and 32 are commonly coupled. The control terminal (for example, gate) of the NMOS transistor 31 is provided with the input voltage Vin1. The control terminal of the NMOS transistor 32 is provided with the output voltage Vout. A second terminal (for example, drain) of the NMOS transistor 31 is coupled to the current node N1. A second terminal of the NMOS transistor 32 is coupled to the current node N2. The first pair of differential currents include a current I (31) and a current I (32) where I (31) is the current flowing through the NMOS transistor 31 and I (32) is the current flowing through the NMOS transistor 32.

The first current source 41 is provided between a first power supply (low potential power supply) for providing a first supply voltage (for example, low potential supply voltage VSS) and the first differential pair 21. The first current source 41 supplies an operating current to the first differential pair 21.

The second differential pair 22 outputs a second pair of differential currents to the first current node pair (N1, N2) based on the difference between the input voltage Vin2 and the output voltage Vout. The second differential pair 22 includes transistors of the first conductivity type (for example, N-type MOS transistors). In the example shown in FIG. 1, the second differential pair 22 includes a third differential input transistor (for example, an NMOS transistor 33) and a fourth differential input transistor (for example, an NMOS transistor 34). First terminals (for example, sources) of the NMOS transistors 33 and 34 are commonly coupled. The control terminal (for example, gate) of the NMOS transistor 33 is provided with the input voltage Vin2. The control terminal of the NMOS transistor 34 is provided with the output voltage Vout. A second terminal (for example, drain) of the NMOS transistor 33 is coupled to the current node N1. A second terminal of the NMOS transistor 34 is coupled to the current node N2. The second pair of differential currents include a current I (33) and a current I (34) where I (33) is the current flowing through the NMOS transistor 33 and I (34) is the current flowing through the NMOS transistor 34.

The second current source 42 is provided between the first power supply (low potential power supply) for providing the first supply voltage (for example, low potential supply voltage VSS) and the second differential pair 22. The second current source 42 supplies an operating current to the second differential pair 22.

The first pair of differential currents outputted by the first differential pair 21 and the second pair of differential currents outputted by the second differential pair 22 are combined at the first current node pair (N1, N2). Namely, a first output current I (N1) (=I (31)+I (33)) is generated at the first current node N1 by combining the current I (31) and current I (33), and a second output current I (N2) (=I (32)+I (34)) is generated at the second current node N2 by combining the current I (32) and current I (34). The first and second output currents I (N1) and I (N2) make up the differential current outputs of the first current node pair (N1, N2) on the n-channel differential pair side of the differential input section 10.

The third differential pair 23 outputs a third pair of differential currents to a second current node pair (N3, N4) based on the difference between the input voltage Vin1 and the output voltage Vout. In FIG. 1, the second current node pair includes current nodes N3 and N4. The third differential pair 23 includes transistors of a second conductivity type (for example, P-type MOS transistors). In the example shown in FIG. 1, the third differential pair 23 includes a fifth differential input transistor (for example, a PMOS transistor 35) and a sixth differential input transistor (for example, a PMOS transistor 36). First terminals (for example, sources) of the PMOS transistors 35 and 36 are commonly coupled. The control terminal (for example, gate) of the PMOS transistor 35 is provided with the input voltage Vin1. The control terminal of the PMOS transistor 36 is provided with the output voltage Vout. A second terminal (for example, drain) of the PMOS transistor 35 is coupled to the current node N3. A second terminal of the PMOS transistor 36 is coupled to the current node N4. The third pair of differential currents include a current I (35) and a current I (36) where I (35) is the current flowing through the PMOS transistor 35 and I (36) is the current flowing through the PMOS transistor 36.

The third current source 43 is provided between a second power supply (high potential power supply) for providing a second supply voltage (for example, high potential supply voltage VDD) and the third differential pair 23. The third current source 43 supplies an operating current to the third differential pair 23.

The fourth differential pair 24 outputs a fourth pair of differential currents to the second current node pair (N3, N4) based on the difference between the input voltage Vin2 and the output voltage Vout. The fourth differential pair 24 includes transistors of the second conductivity type (for example, P-type MOS transistors). In the example shown in FIG. 1, the fourth differential pair 24 includes a seventh differential input transistor (for example, a PMOS transistor 37) and an eighth differential input transistor (for example, a PMOS transistor 38). First terminals (for example, sources) of the PMOS transistors 37 and 38 are commonly coupled. The control terminal (for example, gate) of the PMOS transistor 37 is provided with the input voltage Vin2. The control terminal of the PMOS transistor 38 is provided with the output voltage Vout. A second terminal (for example, drain) of the PMOS transistor 37 is coupled to the current node N3. A second terminal of the PMOS transistor 38 is coupled to the current node N4. The fourth pair of differential currents include a current I (37) and a current I (38) where I (37) is the current flowing through the PMOS transistor 37 and I (38) is the current flowing through the PMOS transistor 38.

The fourth current source 44 is provided between the second power supply (high potential power supply) for providing the second supply voltage (for example, high potential supply voltage VDD) and the fourth differential pair 24. The fourth current source 44 supplies an operating current to the fourth differential pair 24.

The third pair of differential currents outputted by the third differential pair 23 and the fourth pair of differential currents outputted by the fourth differential pair 24 are combined at the second current node pair (N3, N4). Namely, a third output current I (N3) (=I (35)+I (37)) is generated at the third current node N3 by combining the current I (35) and current I (37), and a fourth output current I (N4) (=I (36)+I (38)) is generated at the fourth current node N4 by combining the current I (36) and current I (38). The third and fourth output currents I (N3) and I (N4) make up the differential current outputs of the second current node pair (N3, N4) on the p-channel differential pair side of the differential input section 10.

The first control circuit 51 is provided between the first differential pair 21 and the first current source 41. To the first differential pair 21, when the input voltage Vin1 is equal to or higher than the input voltage Vin2 (Vin1≧Vin2), the input voltage Vin1 that has a larger margin of voltage difference, than the input voltage Vin2 does, from the first supply voltage (low potential supply voltage VSS) is inputted. The first control circuit 51 controls the changing point of the operating current supplied to the first differential pair 21. This control is performed in a first operating range in which the amounts of currents flowing, based on the input voltages Vin1 and Vin2 and the output voltage Vout, through the first and second differential pairs 21 and 22, respectively, become smaller than the operating currents set by the first and second current sources 41 and 42, respectively. In the present embodiment, a resistor R1 is used as the first control circuit 51. With the differential amplifier 1 having a steady-state characteristic according to which the input voltage Vin1 is higher in potential than the input voltage Vin2 by a voltage difference of ΔV, the resistor R1 is set to such a resistance value which causes a first changing point to approach a second changing point. The first changing point is where the current (I (31)+I (32)) flowing through the transistor pair included in the first differential pair 21 provided with the high potential input voltage Vin1 starts, as the input voltages Vin1 and Vin2 drop, decreasing below the current set by the current source 41 and the second changing point is where the current (I (33)+I (34)) flowing through the transistor pair included in the second differential pair 22 provided with the low potential input voltage Vin2 starts, as the input voltages Vin1 and Vin2 drop, decreasing below the current set by the current source 42.

The second control circuit 52 is provided between the fourth differential pair 24 and the fourth current source 44. To the fourth differential pair 24, when the input voltage Vin1 is equal to or higher than the input voltage Vin2 (Vin1≧Vin2), the input voltage Vin2 that has a larger margin of voltage difference, than the input voltage Vin1 does, from the second supply voltage (high potential supply voltage VDD) is inputted. The second control circuit 52 controls the changing point of the operating current supplied to the fourth differential pair 24. This control is performed in a second operating range in which the amounts of currents flowing, based on the input voltages Vin1 and Vin2 and the output voltage Vout, through the third and fourth differential pairs 23 and 24, respectively, become smaller than the operating currents set by the third and fourth current sources 43 and 44, respectively. In the present embodiment, a resistor R2 is used as the second control circuit 52. The resistor R2 is set to such a resistance value which causes a third changing point to approach a fourth changing point. The third changing point is where the current (I (37)+I (38)) flowing through the transistor pair included in the fourth differential pair 24 provided with the low potential input voltage Vin2 starts, as the input voltages Vin1 and Vin2 rise, decreasing below the current set by the current source 44 and the fourth changing point is where the current (I (35)+I (36)) flowing through the transistor pair included in the third differential pair 23 provided with the high potential input voltage Vin1 starts, as the input voltages Vin1 and Vin2 rise, decreasing below the current set by the current source 43.

The output amplification section 11 has a first current mirror 60, a first connection circuit 70, a second connection circuit 72, and a second current mirror 80.

The first current mirror 60 includes a first transistor pair of the second conductivity type coupled to the second power supply (for example, high potential power supply). The first transistor pair is coupled to the first current node pair (N1, N2). The first current mirror 60 also includes a third transistor pair of the second conductivity type. The first transistor pair includes a first mirror transistor (for example, a PMOS transistor 61) and a second mirror transistor (for example, a PMOS transistor 62). The third transistor pair includes a third mirror transistor (for example, a PMOS transistor 63) and a fourth mirror transistor (for example, a PMOS transistor 64).

First terminals (for example, sources) of the PMOS transistors 61 and 62 are commonly coupled to the high potential power supply, and their control terminals (for example, gates) are commonly coupled. A node (for example, the current node N1) included in the first current node pair (N1, N2) is coupled to a second terminal (for example, drain) of the PMOS transistor 62. The other node (for example, the current node N2) included in the first current node pair (N1, N2) is coupled to a second terminal (for example, drain) of the PMOS transistor 61.

A first terminal (for example, source) of the PMOS transistor 63 is coupled to the second terminal (for example, drain) of the PMOS transistor 61. A first terminal (for example, source) of the PMOS transistor 64 is coupled to the second terminal (for example, drain) of the PMOS transistor 62. A control terminal (for example, gate) of the PMOS transistor 64 is coupled to the gate of the PMOS transistor 63. A first bias voltage BP1 is applied to the common gate of the PMOS transistors 63 and 64. The drain of the PMOS transistor 63 is used as an input node of the first current mirror 60 and is coupled to the common gate of the PMOS transistors 61 and 62. The drain of the PMOS transistor 64 is used as an output node of the first current mirror 60.

The second current mirror 80 includes a second transistor pair of the first conductivity type coupled to the first power supply (for example, low potential power supply). The second transistor pair is coupled to the second current node pair (N3, N4). The second current mirror 80 also includes a fourth transistor pair of the second conductivity type. The second transistor pair includes a fifth mirror transistor (for example, an NMOS transistor 81) and a sixth mirror transistor (for example, an NMOS transistor 82). The fourth transistor pair includes a seventh mirror transistor (for example, an NMOS transistor 83) and an eighth mirror transistor (for example, an NMOS transistor 84).

First terminals (for example, sources) of the NMOS transistors 81 and 82 are commonly coupled to the low potential power supply, and their control terminals (for example, gates) are commonly coupled. A node (for example, the current node N3) included in the second current node pair (N3, N4) is coupled to a second terminal (for example, drain) of the NMOS transistor 82. The other node (for example, the current node N4) included in the second current node pair (N3, N4) is coupled to a second terminal (for example, drain) of the PMOS transistor 81.

A first terminal (for example, source) of the NMOS transistor 83 is coupled to the second terminal (for example, drain) of the NMOS transistor 81. A first terminal (for example, source) of the NMOS transistor 84 is coupled to the second terminal (for example, drain) of the NMOS transistor 82. A control terminal (for example, gate) of the NMOS transistor 84 is coupled to the gate of the NMOS transistor 83. A second bias voltage BN1 is applied to the common gate of the NMOS transistors 83 and 84. The drain of the NMOS transistor 83 is used as an input node of the second current mirror 80 and is coupled to the common gate of the NMOS transistors 81 and 82. The drain of the NMOS transistor 84 is used as an output node of the second current mirror 80.

The first connection circuit 70 is coupled between the input node of the first current mirror 60 (drain of the PMOS transistor 63) and the input node of the second current mirror 80 (drain of the MNOS transistor 83). The first connection circuit 70 includes a current source 71. The second connection circuit 72 is coupled between the output node (drain of the PMOS transistor 64) included in the first current mirror 60 and the output node of the second current mirror 80 (drain of the NMOS transistor 84). The second connection circuit 72 includes a first floating transistor of the first conductivity type (for example, an NMOS transistor 73) and a second floating transistor of the second conductivity type (for example, a PMOS transistor 74), the first and second floating transistors being coupled in parallel to each other. A third bias voltage BN2 is applied to the control terminal (for example, gate) of the NMOS transistor 73. A fourth bias voltage BP2 is applied to the control terminal (for example, gate) of the PMOS transistor 74.

A first output transistor is a transistor of the second conductivity type (for example, a PMOS transistor 91). The PMOS transistor 91 is coupled between an output terminal T3 for outputting the output voltage Vout and the second power supply (for example, the high potential power supply). The control terminal (for example, gate) of the PMOS transistor 91 is coupled to the node where the output node of the first current mirror 60 and one end of the second connection circuit 72 are coupled to each other.

A second output transistor is a transistor of the first conductivity type (for example, an NMOS transistor 92). The NMOS transistor 92 is coupled between the output terminal T3 for outputting the output voltage Vout and the first power supply (for example, the low potential power supply). The control terminal (for example, gate) of the NMOS transistor 92 is coupled to the node where the output node of the second current mirror 80 and another end of the second connection circuit 72 are coupled to each other.

Furthermore, the differential amplifier 1 includes capacitors C1 and C2 which are phase compensation capacitors. The capacitor C1 is coupled between the output terminal T3 and the current node N1. The capacitor C2 is coupled between the output terminal T3 and the current node N3.

The operation of the differential amplifier 1 according to the first embodiment will be described below. In the following description, it is assumed that the expected output voltage (hereinafter referred to as the "output voltage setting") of the differential amplifier 1 is set to an intermediate value between the input voltages Vin1 and Vin2 ((Vin1+Vin2)/2). The input voltages Vin1 and Vin2 can be expressed using potential difference ΔV (=Vin1−Vin2) between them as follows: the input voltage Vin1 is higher than the output voltage setting by ΔV/2; and the input voltage Vin2 is lower than the output voltage setting by ΔV/2. Also, in the following description, the currents flowing through the NMOS transistors 31 to 34 are represented by I (31) to I (34), respectively, and the currents flowing through the PMOS transistors 35 to 38 are represented, in absolute value, by I (35) to I (38), respectively.

In describing each embodiment, a first operating range and a second operating range are defined with respect to the output voltage setting based on the steady-state characteristics of the differential amplifier. The first operating range is a range of output voltage setting over which the amounts of currents flowing, based on the voltage differences between the input voltages Vin1 and Vin2 and the output voltage Vout, through the first and second differential pairs 21 and 22, respectively, become smaller than the operating currents set by the first and second current sources 41 and 42, respectively. To be more concrete, when the input voltages Vin1 and Vin2 lower approaching the low potential supply voltage VSS, the voltage at the common source terminal of the first and second differential pairs 21 and 22 lowers and reaches the low potential supply voltage VSS. When the input voltage Vin1 and Vin2 further lower, with the common source terminal voltage of the first and second differential pairs 21 and 22 being unable to lower below the low potential supply voltage VSS, the gate-source voltages of the transistors included in the first and second differential pairs 21 and 22 lower causing the amounts of currents flowing through the differential pairs 21 and 22, respectively, to decrease below the current amounts set by the corresponding current sources. When the input voltage Vin1 and Vin2 still further lower, the transistor pairs included in the first and second differential pairs are turned off. The output voltage setting range over which at least one of the current flowing through the transistor pair included in the first differential pair 21 (the sum of the drain-source currents of the NMOS transistors 31 and 32) and the current flowing through the transistor pair included in the second differential pair 22 (the sum of the drain-source currents of the NMOS transistors 33 and 34) is smaller than the current amount set by the corresponding current source or over which the transistor pairs included in the first and second differential pairs 21 and 22 are off is defined as the first operating range.

The second operating range is a range of output voltage setting over which the amounts of currents flowing, based on the input voltages Vin1 and Vin2 and the output voltage Vout, through the third and fourth differential pairs 23 and 24, respectively, become smaller than the operating currents set by the third and fourth current sources 43 and 44, respectively. To be more concrete, when the input voltages Vin1 and Vin2 rise approaching the high potential supply voltage VDD, the voltage at the common source terminal of the third and fourth differential pairs 23 and 24 rises and reaches the high potential supply voltage VDD. When the input voltages Vin1 and Vin2 further rise, with the common source terminal voltage of the third and fourth differential pairs 23 and 24 being unable to rise above the high potential supply voltage VDD, the gate-source voltages of the transistors included in the third and fourth differential pairs 23 and 24 lower causing the amounts of currents flowing through the differential pairs 23 and 24, respectively, to decrease below the current amounts set by the corresponding current sources. When the input voltage Vin1 and Vin2 still further rise, the transistor pairs included in the third and fourth differential pairs are turned off. The output voltage setting range over which at least one of the current flowing through the transistor pair included in the third differential pair 23 (the sum of the drain-source currents of the PMOS transistors 35 and 36) and the current flowing through the transistor pair included in the fourth differential pair 24 (the sum of the drain-source currents of the PMOS transistors 37 and 38) is smaller than the current amount set by the corresponding current source or over which the transistor pairs included in the third and fourth differential pairs 23 and 24 are off is defined as the second operating range.

The first control circuit 51 controls the changing point at which, with the input voltages Vin1 and Vin2 having a voltage difference ΔV (>0) between them, the operating current of the transistors 31 and 32 (I (31)+I (32)) included in the first differential pair 21 starts, with the output voltage setting being in the first operating range, decreasing corresponding to the lowering of the input voltages Vin1 and Vin2. Since the sources of the transistors 31 and 32 are commonly coupled, the changing point of the operating current (I (31)+I (32)) and the individual changing points of the currents I (31) and I (32) are identical. To be more concrete, as the input voltages Vin1 and Vin2 lower, the current (I (33)+I (34)) flowing through the transistor pair included in the second differential pair 22 provided with the low potential input voltage Vin2 starts decreasing below the current set by the current source 42. At this time, the first control circuit 51 makes control to cause the changing point at which the current (I (31)+I (32)) flowing through the transistor pair included in the first differential pair 21 provided with the high potential input voltage Vin1 starts decreasing below the current set by the current source 41 to approach the changing point at which the current flowing through the second differential pair starts decreasing. In this way, in the first operating range, the increase in the difference between the first output current and the second output current (I (N1)−I (N2)) in the differential input section 10 is suppressed so as to suppress the increase (in the positive direction) in the output voltage error. The changing points at which the amounts of currents flowing through the first and second differential pairs 21 and 22, respectively, start decreasing need not necessarily agree with each other. The control to be performed is desired to cause, with the input voltages Vin1 and Vin2 differing from each other by a predetermined voltage difference ΔV, the changing points at which the amounts of currents flowing through the first and second differential pairs 21 and 22, respectively, start decreasing to come adequately close to each other.

The second control circuit 52 controls the changing point at which, with the input voltages Vin1 and Vin2 having a voltage difference ΔV (>0) between them, the operating current of the transistors 37 and 38 (I (37)+I (38)) included in the fourth differential pair 24 starts, with the output voltage setting being in the second operating range, decreasing corresponding to the rising of the input voltages Vin1 and Vin2. Since the sources of the transistors 37 and 38 are commonly coupled, the changing point of the operating current (I (37)+I (38)) and the individual changing points of the currents I (37) and I (38) are identical. To be more concrete, as the input voltages Vin1 and Vin2 rise, the current (I (35)+I (36)) flowing through the transistor pair included in the third differential pair 23 provided with the high potential input voltage Vin1 starts decreasing below the current set by the current source 43. At this time, the second control circuit 52 makes control to cause the changing point at which the current (I (37)+I (38)) flowing through the transistor pair included in the fourth differential pair 24 provided with the low potential input voltage Vin2 starts decreasing below the current set by the current source 44 to approach the changing point at which the current flowing through the third differential pair starts decreasing. In this way, in the second operating range, the increase in the difference between the third output current and the fourth output current (I (N3)−I (N4)) in the differential input section 10 is suppressed so as to suppress the increase (in the negative direction) in the output voltage error. The changing points at which the amounts of currents flowing through the third and fourth differential pairs 23 and 24, respectively, start decreasing need not necessarily agree with each other. The control to be performed is desired to cause, with the input voltages Vin1 and Vin2 differing from each other by a predetermined voltage difference ΔV, the changing points at which the amounts of currents flowing through the third and fourth differential pairs 23 and 24, respectively, start decreasing to come adequately close to each other.

Figure 2:
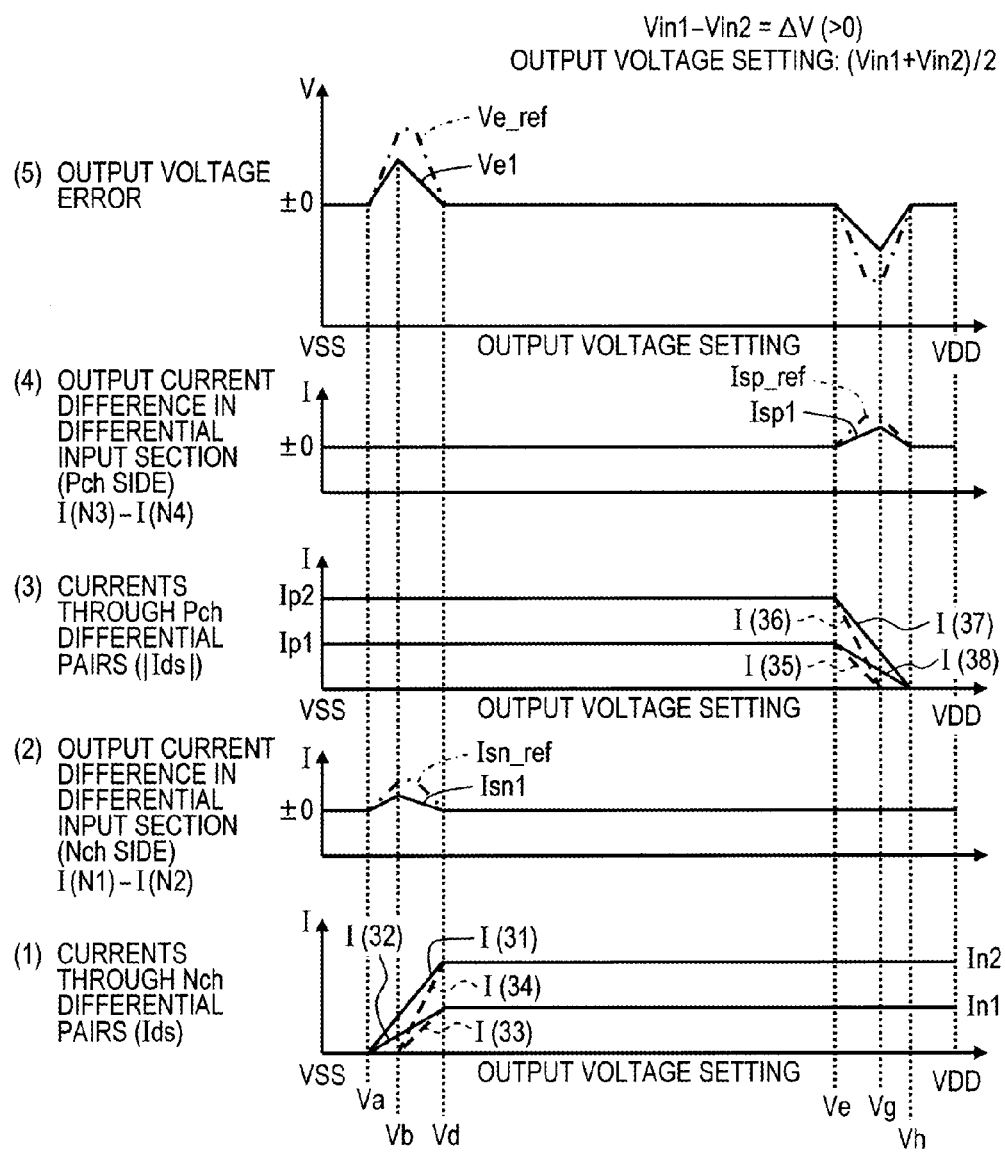
FIG. 2 shows graphs representing steady-state characteristics of the output voltage setting and output voltage error of the differential amplifier of the first embodiment.
Figure 3:
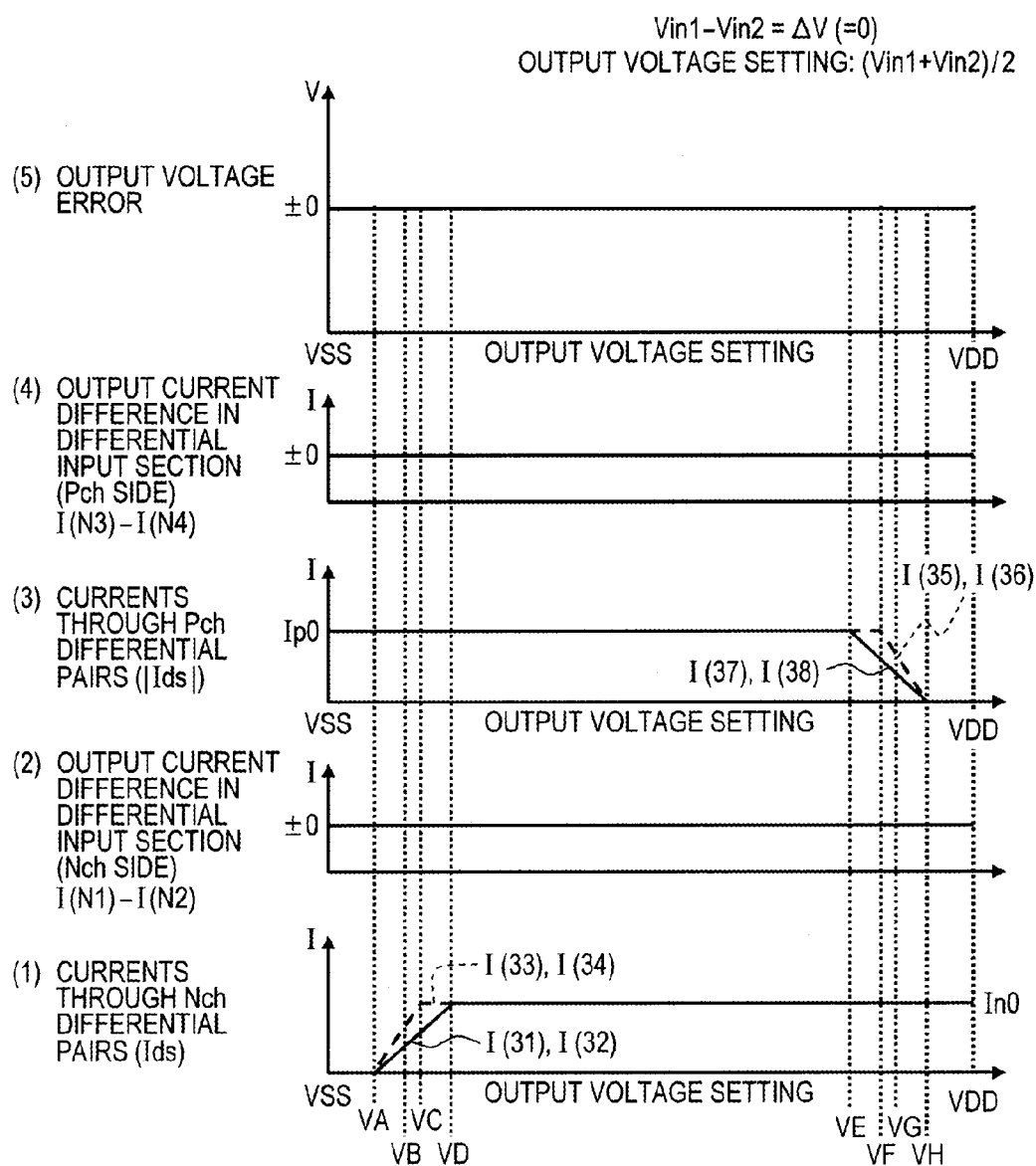
FIG. 3 shows graphs representing steady-state characteristics of the output voltage setting and output voltage error of the differential amplifier of the first embodiment.

In the following, the operation described above of the differential amplifier 1 according to the first embodiment will be described in more detail with reference to graphs representing steady-state characteristics of the output voltage setting and output voltage error. FIGS. 2 and 3 show graphs representing steady-state characteristics of the output voltage setting and output voltage error of the differential amplifier 1.

Figure 12:
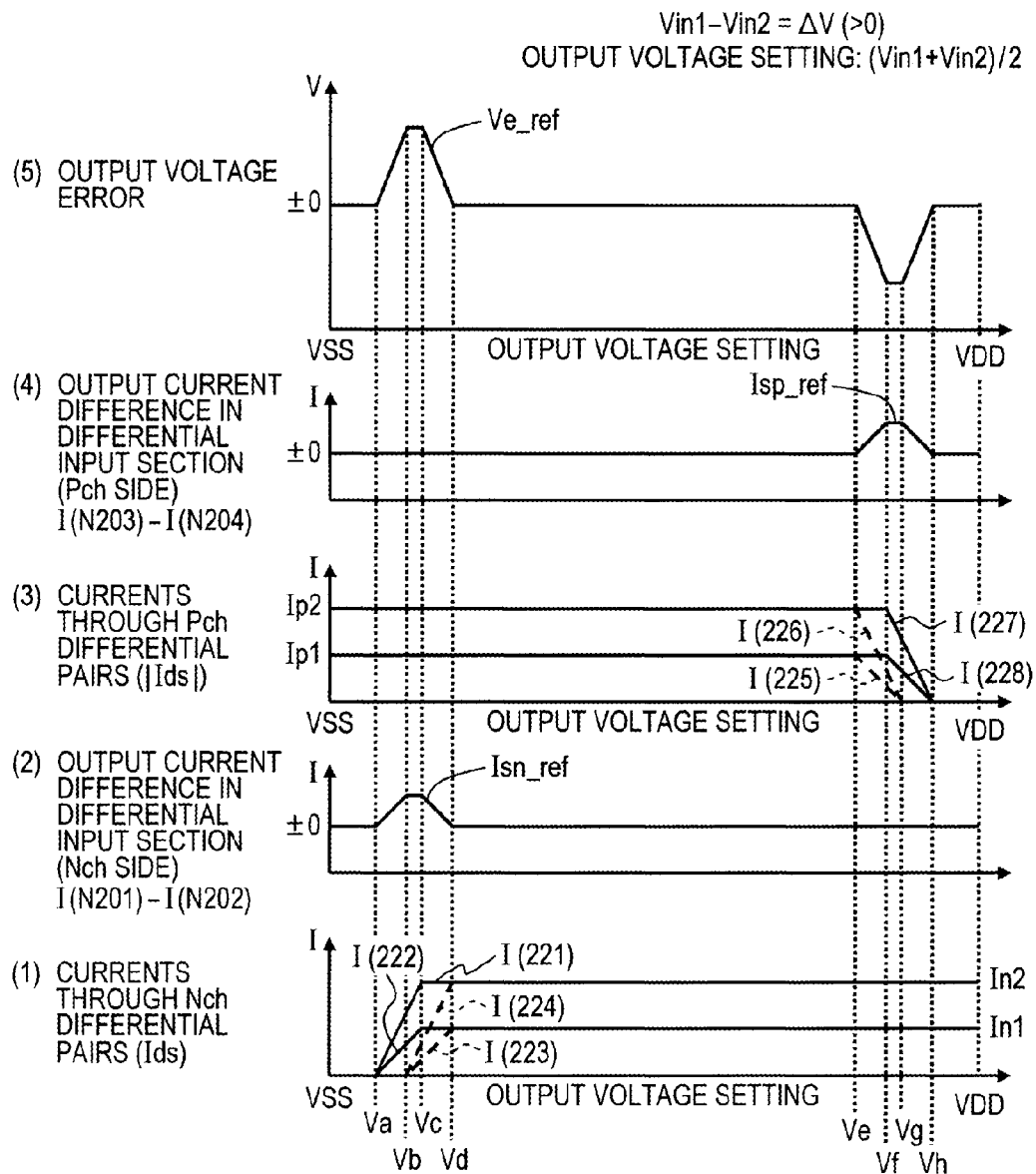
FIG. 12 shows graphs representing steady-state characteristics of the output voltage setting and output voltage error of the output amplifier disclosed in Japanese Patent Laid-Open No. 2006-050296, the graphs being for explaining the mechanism by which the output voltage error enlarges in the output amplifier.
Figure 13:
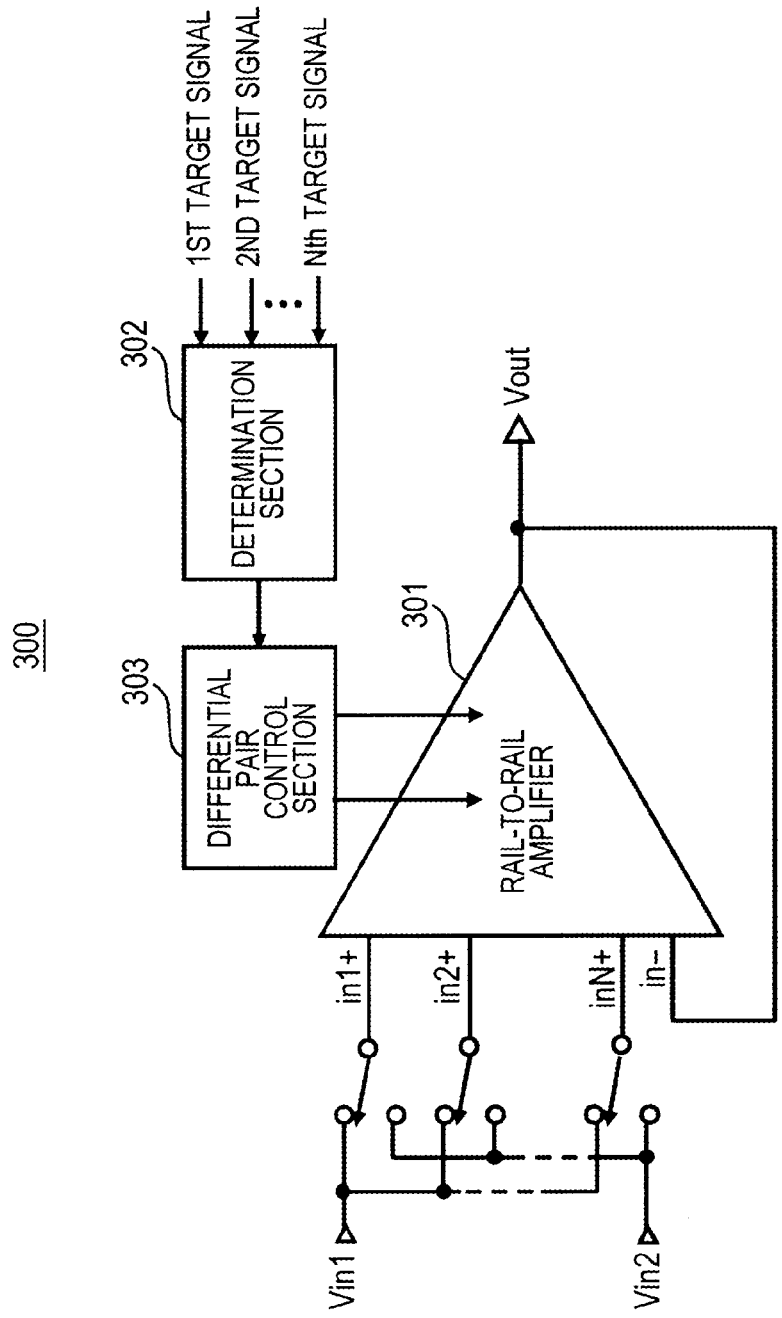
FIG. 13 is a block diagram of the output amplifier disclosed in Japanese Patent Laid-Open No. 2006-050296.
Figure 14:
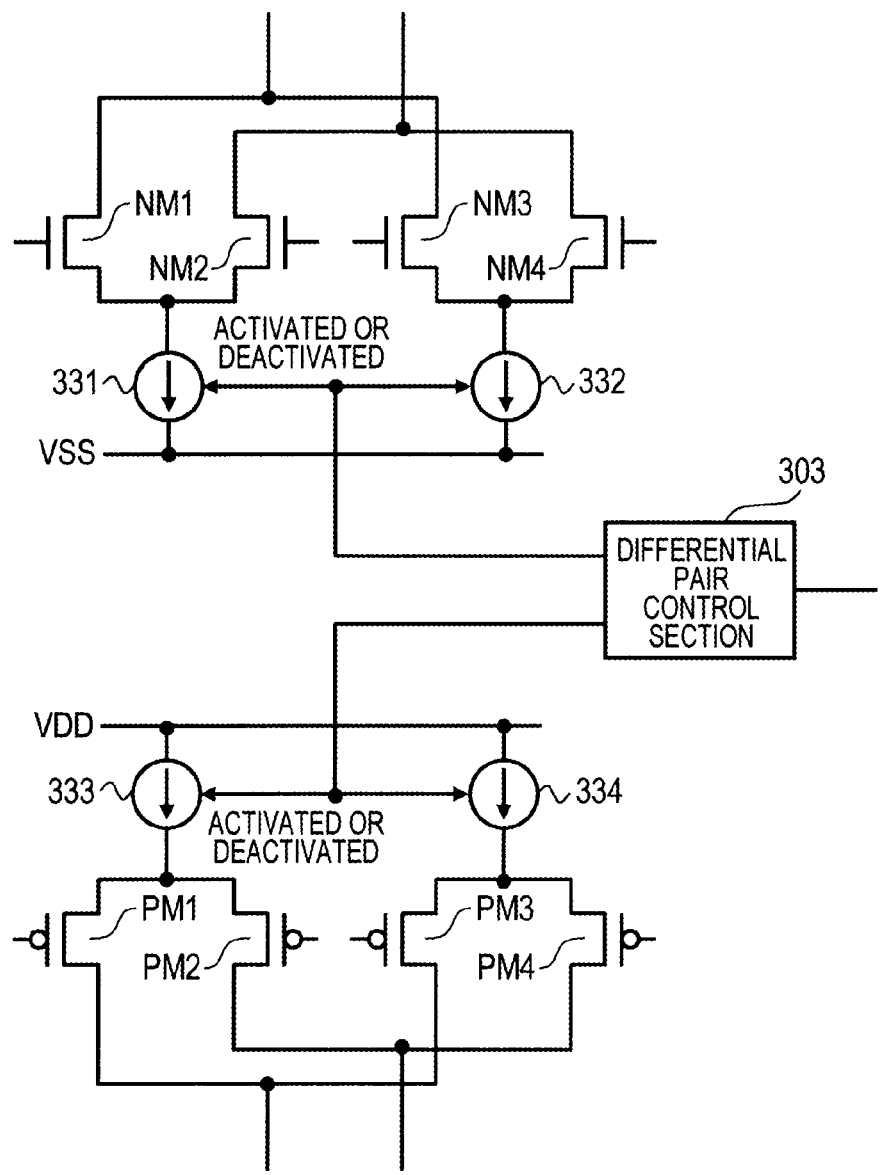
FIG. 14 is a detailed block diagram of the output amplifier shown in FIG. 13.

First, the operation performed when the input voltages Vin1 and Vin2 differ from each other will be described with reference to FIG. 2. In the example shown in FIG. 2, the input voltage Vin1 is set to be higher than the input voltage Vin2 by ΔV (>0). When, in the differential amplifier 1 shown in FIG. 1, interpolation is normally performed, the first and second differential pairs 21 and 22 satisfy the equivalent relationships represented by the foregoing equations (7) and (8) of the output amplifier 188 (shown in FIG. 10) based on the related technology. When the input voltage Vin1 is higher in potential than the input voltage Vin2, the currents I (31) and I (34) are larger than the currents I (32) and I (33). The currents I (31) to I (34) are related as follows: I (31)=I (34)=In2; and I (32)=I (33)=In1; where In2>In1. The total current (In2+In1) corresponds to the current values outputted from the current sources 41 and 42 (outputting equal currents). The third and fourth differential pairs 23 and 24 also maintain similar current relationships. Namely, when, with the input voltage Vin1 being higher than the input voltage Vin2, interpolation is performed normally, the currents I (37) and I (36) are larger than the currents I (35) and I (38), and the currents I (35) to I (38) are related as follows: I (37)=I (36)=Ip2; and I (35)=I (38)=Ip1; where Ip2>Ip1. The total current (Ip2+Ip1) corresponds to the current values outputted from the current sources 43 and 44 (outputting equal currents). The current values in the third and fourth differential pairs 23 and 24 are represented by absolute values of their drain-to-source currents. To make comparison easy between the characteristics of the differential amplifier 1 shown in FIG. 1 and the characteristics (shown in FIG. 12) of the output amplifier 188 (shown in FIG. 10) based on related technology, the characteristics shown in parts (2), (4) and (5) of FIG. 12 are also shown, in chain line, in parts (2), (4) and (5) of FIG. 2.

In FIG. 2, part (1) represents the characteristics of currents flowing through the first and second differential pairs 21 and 22, respectively. In part (1), currents I (31) and I (32) are represented by solid lines and currents I (33) and I (34) are represented by broken lines. When the output voltage setting is in a range near the high potential supply voltage VDD, the currents flowing through the transistors included in the first and second differential pairs 21 and 22, respectively, are kept constant. Namely, the currents I (31) and I (34) are kept at In2, and the currents I (32) and I (33) are kept at In1. In this state, interpolation is performed normally. When, with the output voltage setting being in a range near the low potential supply voltage VSS, the input voltages Vin1 and Vin2 lower causing the output voltage setting to reach Vd, first the common source terminal of the second differential pair 22 provided with the low potential input voltage Vin2 reaches the low potential supply voltage VSS. When the output voltage setting further lowers, with the common source terminal voltage of the second differential pair 22 being unable to drop below the low potential supply voltage VSS, the gate-source voltages of the transistors 33 and 34 included in the second differential pair 22 lower. Subsequently, as the output voltage setting drops below Vd, the currents I (33) and I (34) start decreasing. In this process, voltage Vd is the changing point at which the operating current of the second differential pair 22 starts decreasing. When the output voltage setting further drops to Vb, the currents I (33) and I (34) become almost zero causing the n-channel differential pair (33, 34) to stop. The first operating range is where the output voltage setting ranges from voltage Vd to the low supply voltage VSS.

The common source terminal voltage of the first differential pair 21 provided with the input voltage Vin1 is coupled to the current source 41 via a resistor R1. The resistor R1 is set to a value which, in the first operating range, causes the changing point at which the operating current of the first differential pair 21 starts decreasing to approach the changing point (Vd) at which the operating current of the second differential pair 22 starts decreasing. The changing point at which the operating current of the first differential pair 21 starts decreasing can be set by the current value set at the current source 41 and the value of the resistor R1. In the example shown in FIG. 2, the changing point at which the operating current of the first differential pair 21 starts decreasing is set to voltage Vd. With the resistor R1 set to such a value, when the input voltages Vin1 and Vin2 lower causing the output voltage setting to drop to voltage Vd, the voltage at the node between the resistor R1 and the current source 41 reaches the low potential supply voltage VSS. When the output voltage setting further drops, with the voltage at the node between the resistor R1 and the current source 41 being unable to drop below the low potential supply voltage VSS, the current flowing through the resistor R1 decreases and the gate-source voltages of the transistors 31 and 32 included in the first differential pair 21 lower. Subsequently, as the output voltage setting drops below voltage Vd, the currents I (31) and I (32) start decreasing. When the output voltage setting drops to voltage Va, the current flowing through the resistor R1 and the currents I (31) and I (32) become almost zero causing the first differential pair 21 to stop. Namely, with the resistor R1 provided, the voltage Vd at which the currents flowing through the transistor pair included in the first differential pair 21 start decreasing is higher in potential than the voltage Vc at which the corresponding currents start decreasing in the amplifier (shown in FIG. 10) based on related-art technology, so that the current decrease is more gradual in the present embodiment than in the case of the amplifier shown in FIG. 10.

In FIG. 2, part (2) represents the characteristic (characteristic curve Isn1) of the output current difference between the current nodes N1 and N2 (I (N1)–I (N2)) in the differential input section 10. The output current I (N1) is the sum of the currents I (31) and I (33), and the output current I (N2) is the sum of the currents I (32) and I (34). The output currents I (N1) and I (N2) are respectively combined with the currents flowing through the output side node and input side node of the current mirror 60 included in the output amplification section 11. Normally, when interpolation is normally performed based on the steady-state characteristics, the output current difference (I (N1)–I (N2)) is zero. Referring to part (2) of FIG. 2, the output current difference (I (N1)–I (N2)) is zero on the high potential supply voltage VDD side, but it increases in the positive direction in the output voltage setting range of voltage Vd to voltage Va near the low potential supply voltage VSS. This increase in the output current difference (I (N1)–I (N2)) depends on changes in the currents I (31) to I (34) shown in part (1) of FIG. 2. To be concrete, as shown in part (1) of FIG. 2, when the output voltage setting drops below voltage Vd, the currents I (33) and I (34) both decrease. At this time, the current I (34) decreases more than the current I (33). When the output voltage setting drops below voltage Vd, the currents I (31) and I (32) also decrease. At this time, the current I (31) decreases more than the current I (32). According to calculations of the values of the currents I (31) to I (34), the output current difference (I (N1)–I (N2)) increases in the positive direction reaching a peak when the output voltage setting reaches voltage Vb. When the output voltage setting drops from Vb to Va, the output current difference (I (N1)–I (N2)) decreases to zero and remains zero in the range of output voltage setting from Va to VSS.

Referring to part (2) of FIG. 2, the increase (represented in solid line) in the output current difference (I (N1)–I (N2)) in the differential amplifier 1 is smaller than the increase (represented, in FIG. 2, by characteristic curve Isn_ref in chain line) in the output current difference (I (N201)–I (N202)) (shown in part (2) of FIG. 12) in the amplifier (shown in FIG. 10) using the related-art technology. This is because, for the differential amplifier 1, the changing point at which the operating current of the first differential pair 21 starts decreasing in the first operating range has been shifted by addition of the resistor R1.

In the foregoing description of the related-art technology made with reference to FIG. 12, it has been stated that, when the output current difference (I (N201)–I (N202)) increases in the positive direction, the output voltage error correspondingly increases toward a higher potential (in the positive direction). Referring to part (5) of FIG. 2, even though the output voltage error (characteristic curve Ve1) also increases to a higher potential (in the positive direction) corresponding to the increase in the output current difference (I (N1)–I (N2)) represented by the characteristic curve (Isn1) in part (2) of FIG. 2, the output voltage error is smaller than the output voltage error based on the related-art technology (represented, in FIG. 2, by characteristic curve Ve_ref in chain line) shown in part (5) of FIG. 12.

In FIG. 2, part (3) represents the characteristics of the currents flowing through the third and fourth differential pairs 23 and 24, respectively. In part (3) of FIG. 2, the currents I (37) and I (38) are represented by solid lines, and the currents I (35) and I (36) are represented by broken lines. When the output voltage setting is in a range on the low potential supply voltage VSS side, of the currents flowing through the third and fourth differential pairs 23 and 24, the currents I (35) and I (38) are kept at Ip1 and the currents I (36) and I (37) are kept at Ip2. In this state, interpolation is performed normally. When, with the output voltage setting being in a range on the high potential supply voltage VDD side, the input voltages Vin1 and Vin2 rise causing the output voltage setting to rise to voltage Ve, the common source terminal of the third differential pair 23 provided with the high potential input voltage Vin1 reaches the high potential supply voltage VDD. When the output voltage setting further rises, with the common source terminal voltage of the third differential pair 23 being unable to rise above the high potential supply voltage VDD, the gate-source voltages of the transistors 35 and 36 included in the third differential pair 23 lower in absolute value. Subsequently, as the output voltage setting rises above Ve, the currents I (35) and I (36) start decreasing. When the output voltage setting rises to voltage Vg, the currents I (35) and I (36) become almost zero causing the third differential pair 23 to stop. The second operating range is where the output voltage setting ranges from voltage Ve to the high potential supply voltage VDD. Voltage Ve is the changing point at which the operating current of the third differential pair 23 starts decreasing.

The common source terminal of the fourth differential pair 24 provided with the input voltage Vin2 is coupled to the current source 44 via a resistor R2. The resistor R2 is set to a value which, in the second operating range, causes the changing point at which the operating current of the fourth differential pair 24 starts decreasing to approach the changing point (Ve) at which the operating current of the third differential pair 23 starts decreasing. The changing point at which the operating current of the fourth differential pair 24 starts decreasing can be set by the current value set at the current source 44 and the value of the resistor R2. In the example shown in FIG. 2, the changing point at which the operating current of the fourth differential pair 24 starts decreasing is set to voltage Ve. With the resistor R2 set to such a value, when the input voltages Vin1 and Vin2 rise causing the output voltage setting to rise to voltage Ve, the voltage at the node between the resistor R2 and the current source 44 reaches the high potential supply voltage VDD. When the output voltage setting further rises, with the voltage at the node between the resistor R2 and the current source 44 being unable to rise above the high potential supply voltage VDD, the current flowing through the resistor R2 decreases and the gate-source voltages of the transistors 37 and 38 included in the fourth differential pair 24 lower (in absolute value). Subsequently, as the output voltage setting rises above voltage Ve, the currents I (37) and I (38) start decreasing. When the output voltage setting rises to voltage Vh, the current flowing through the resistor R2 and the currents I (37) and I (38) become almost zero causing the fourth differential pair 24 to stop. Namely, with the resistor R2 provided, the voltage Ve at which the currents flowing through the transistor pair included in the fourth differential pair 24 start decreasing is lower in potential than the voltage Vf at which the corresponding currents start decreasing (shown in part (3) of FIG. 12) in the amplifier (shown in FIG. 10) based on the related-art technology, so that the current decrease is more gradual in the present embodiment than in the case of the amplifier shown in FIG. 10.

In FIG. 2, part (4) represents the characteristic (characteristic curve Isp1) of the output current difference between the current nodes N3 and N4 (I (N3)−I (N4)) in the differential input section 10. The output current I (N3) is the sum of the currents I (35) and I (37), and the output current I (N4) is the sum of the currents I (36) and I (38). The output currents I (N3) and I (N4) are respectively combined with the currents flowing through the output side node and input side node of the current mirror 80 included in the output amplification section 11. Normally, when interpolation is normally performed based on the steady-state characteristics, the output current difference (I (N3)−I (N4)) is zero. Referring to part (4) of FIG. 2, the output current difference (I (N3)−I (N4)) is zero on the low potential supply voltage VSS side, but it increases in the positive direction in the output voltage setting range of voltage Ve to Vh near the high potential supply voltage VDD. This increase in the output current difference (I (N3)−I (N4)) depends on changes in the currents flowing through the third and fourth differential pairs 23 and 24 shown in part (3) of FIG. 2. To be concrete, as shown in part (3) of FIG. 2, when the output voltage setting rises above voltage Ve, the currents I (35) and I (36) both decrease. At this time, the current I (36) decreases more than the current I (35). When the output voltage setting rises above voltage Ve, the currents I (37) and I (38) also decrease. According to calculations of the values of the currents I (35) to I (38), the output current difference (I (N3)−I (N4)) increases in the positive direction reaching a peak when the output voltage setting reaches voltage Vg. When the output voltage setting rises from Vg to Vh, the output current difference (I (N3)−I (N4)) decreases to zero and remains zero in the range of output voltage setting from Vh to the high potential supply voltage VDD.

Referring to part (4) of FIG. 2, the increase (represented in solid line) in the output current difference (I (N3)−I (N4)) in the differential amplifier 1 shown in FIG. 1 is smaller than the increase (represented, in FIG. 2, by characteristic curve Isp_ref in chain line) in the output current difference (I (N203)−I (N204)) (shown in part (4) of FIG. 12) in the amplifier (shown in FIG. 10) using the related-art technology. This is because, for the differential amplifier 1, the changing point at which the operating current of the fourth differential pair 24 starts decreasing in the second operating range has been shifted by addition of the resistor R2.

In the foregoing description of the related-art technology made with reference to FIG. 12, it has been stated that, when the output current difference (I (N203)−I (N204)) increases in the positive direction, the output voltage error correspondingly increases toward a lower potential (in the negative direction). Referring to part (5) of FIG. 2, even though the output voltage error (characteristic curve Ve1) also increases to a lower potential (in the negative direction) corresponding to the increase in the output current difference (I (N3)−I (N4)) represented by the characteristic curve (Isp1) in part (4) of FIG. 2, the output voltage error is smaller in absolute value than the output voltage error based on the related-art technology (represented, in FIG. 2, by characteristic curve Ve_ref in chain line) shown in part (5) of FIG. 12.

It has been described above that, in cases where the input voltages Vin1 and Vin2 differ from each other, the increase in the difference between the output currents in the differential input section 10 of the differential amplifier 1 shown in FIG. 1 can be suppressed, in the first and second operating ranges, by addition of the resistors R1 and R2 and that, as a result, the increase in the output voltage error is decreased compared with when the output amplifier 188 (shown in FIG. 10) using related-art technology is used.

Next, the operation performed when the input voltages Vin1 and Vin2 for the differential amplifier 1 shown in FIG. 1 are equal (ΔV=0) will be described with reference to FIG. 3. When the input voltages Vin1 and Vin2 are equal, the output voltage Vout=Vin1 (Vin2), and the currents I (31) and I (32) flowing through the first differential pair 21 and the currents I (33) and I (34) flowing through the second differential pair 22 become equal. In the following, the currents I (31) to I (34) flowing when the operating currents set by the current sources 41 and 42 flow through the differential pairs 21 and 22, respectively, will be referred to as "current In0." The currents I (35) and I (36) flowing through the third differential pair 23 and the currents I (37) and I (38) flowing through the fourth differential pair 24 become equal. In the following, the currents I (35) to I (38) flowing when the operating currents set by the current sources 43 and 44 flow through the differential pairs 23 and 24, respectively, will be referred to as "current Ip0."

In FIG. 3, part (1) represents the characteristics of currents flowing through the first and second differential pairs 21 and 22, respectively. In part (1), currents I (31) and I (32) are represented by solid lines and currents I (33) and I (34) are represented by broken lines. When the output voltage setting is on the high potential supply voltage VDD side, the currents I (31) to I (34) flowing through the first differential pair 21 or second differential pair 22 are kept at In0. When, with the output voltage setting being in a range near the low potential supply voltage VSS, the input voltage Vin1 (Vin2) lowers causing the output voltage setting (=Vin1) to drop to voltage VD, the voltage at the node between the resistor R1 and the current source 41 on the first differential pair 21 side reaches the low potential supply voltage VSS. When the output voltage setting further drops, the current flowing through the resistor R1 decreases and the gate-source voltages of the transistors 31 and 32 included in the first differential pair 21 also decrease. Subsequently, as the output voltage setting drops below voltage VD, the currents I (31) and I (32) start decreasing. When the output voltage setting reaches voltage VA, the current flowing through the resistor R1 and the currents I (31) and I (32) become almost zero causing the first differential pair 21 to stop. When the input voltages Vin1 and Vin2 are equal, the first operating range is where the output voltage setting ranges from voltage VD to the low potential supply voltage VSS.

When the input voltage Vin1 (Vin2) lowers causing the output voltage setting (=Vin1) to drop to voltage VC, the voltage at the common source terminal of the second differential pair 22 drops to the low potential supply voltage VSS. When the output voltage setting further drops, the gate-source voltages of the transistors 33 and 34 of the second differential pair 22 decrease. Subsequently, as the output voltage setting drops below voltage VC, the currents I (33) and I (34) start decreasing. When the output voltage setting reaches voltage VA, the currents I (33) and I (34) become almost zero causing the second differential pair 22 to stop. Namely, with the resistor R1 provided, the voltage VD at which the currents flowing through the transistor pair included in the first differential pair 21 start decreasing is shifted to a higher potential than the voltage VC at which the currents flowing through the second differential pair 22 starts decreasing. This makes the current decreases in the first differential pair 21 more gradual than in the second differential pair 22.

In FIG. 3, part (2) represents the characteristic of the output current difference between the current nodes N1 and N2 (I (N1)–I (N2)) in the differential input section 10. The output current difference (I (N1)–I (N2)) depends on changes, shown in part (1) of FIG. 3, in the currents flowing through the first and second differential pairs 21 and 22, respectively. Referring to part (i) of FIG. 3, the currents I (31) and I (32) and the currents I (33) and I (34) decrease differently when the output voltage setting is in the range of voltage VD to VA. Since, however, the relationships of I (31)=I (32) and I (33)=I (34) are maintained, the output current difference (I (N1)–I (N2)) does not increase. Hence, the output voltage error shown in part (5) of FIG. 3 corresponding to the characteristic of the output current difference (I (N1)–I (N2)) shown in part (2) of FIG. 3 does not increase even when the output voltage setting is near the low potential supply voltage VSS.

In FIG. 3, part (3) represents the characteristics of the currents flowing through the third and fourth differential pairs 23 and 24, respectively. In part (3) of FIG. 3, the currents I (37) and I (38) are represented by solid lines, and the currents I (35) and I (36) are represented by broken lines. When the output voltage setting is in a range on the low potential supply voltage VSS side, the currents I (35) to I (38) flowing through the third differential pair 23 or fourth differential pair 24 are kept at Ip0. When, with the output voltage setting being in a range near the high potential supply voltage VDD, the input voltage Vin1 (Vin2) rises causing the output voltage setting (=Vin1) to rise to voltage VE, the voltage at the node between the resistor R2 coupled to the fourth differential pair 24 and the current source 44 reaches the high potential supply voltage VDD. When the output voltage setting further rises, the current flowing through the resistor R2 decreases and the gate-source voltages of the transistors 37 and 38 included in the fourth differential pair 24 also decrease. Subsequently, as the output voltage setting rises above voltage VE, the currents I (37) and I (38) start decreasing. When the output voltage setting reaches voltage VH, the current flowing through the resistor R2 and the currents I (37) and I (38) become almost zero causing the fourth differential pair 24 to stop. When the input voltages Vin1 and Vin2 are equal, the second operating range is where the output voltage setting ranges from voltage VE to the high potential supply voltage VDD.

When the input voltage Vin1 (Vin2) rises causing the output voltage setting (=Vin1) to rise to voltage VF, the voltage at the common source terminal of the third differential pair (35, 36) rises to the high potential supply voltage VDD. When the output voltage setting further rises, the gate-source voltages of the transistors 35 and 36 of the third differential pair 23 lower. Subsequently, as the output voltage setting rises above voltage VF, the currents I (35) and I (36) start decreasing. When the output voltage setting reaches voltage VH, the currents I (35) and I (36) become almost zero causing the third differential pair 23 to stop. Namely, with the resistor R2 provided, the voltage VE at which the currents flowing through the transistor pair included in the fourth differential pair 24 start decreasing is shifted to a lower potential than the voltage VF at which the currents flowing through the third differential pair 23 start decreasing. This makes the current decreases in the fourth differential pair 24 more gradual than in the third differential pair 23.

In FIG. 3, part (4) represents the characteristic of the output current difference between the current nodes N3 and N4 (I (N3)–I (N4)) in the differential input section 10. The output current difference (I (N3)–I (N4)) depends on changes in the currents flowing through the third and fourth differential pairs 23 and 24, respectively, shown in part (3) of FIG. 3. Referring to part (3) of FIG. 3, the currents I (35) and I (36) and the currents I (37) and I (38) decrease differently when the output voltage setting is in the range of voltage VE to VH. Since, however, the relationships of I (35)=I (36) and I (37)=I (38) are maintained, the output current difference (I (N3)–I (N4)) does not increase. Hence, the output voltage error shown in part (5) of FIG. 3 corresponding to the characteristic of the output current difference (I (N3)–I (N4)) shown in part (4) of FIG. 3 does not increase even when the output voltage setting is near the high potential supply voltage VDD.

It has been described above that, in cases where the input voltages Vin1 and Vin2 are equal, the resistors R1 and R2 do not cause any increase either in the difference between the output currents of the differential input section 10 included in the differential amplifier 1 shown in FIG. 1 or in the output voltage error of the differential amplifier 1.

As described above, in the differential amplifier 1 according to the first embodiment, the first and second control circuits 51 and 52 decrease the difference between the two output currents generated by the two differential pairs of the same conductivity type included in the differential input section 10. This makes it possible, in the differential amplifier 1, to decrease the output voltage error when the output voltage setting is near a supply voltage. Also, in the differential amplifier 1, the first and second control circuits 51 and 52 include the resistors R1 and R2, respectively. Thus, in the differential amplifier 1, the increase in the number of circuit elements can be suppressed while decreasing the output voltage error.

Second Embodiment

Figure 4:
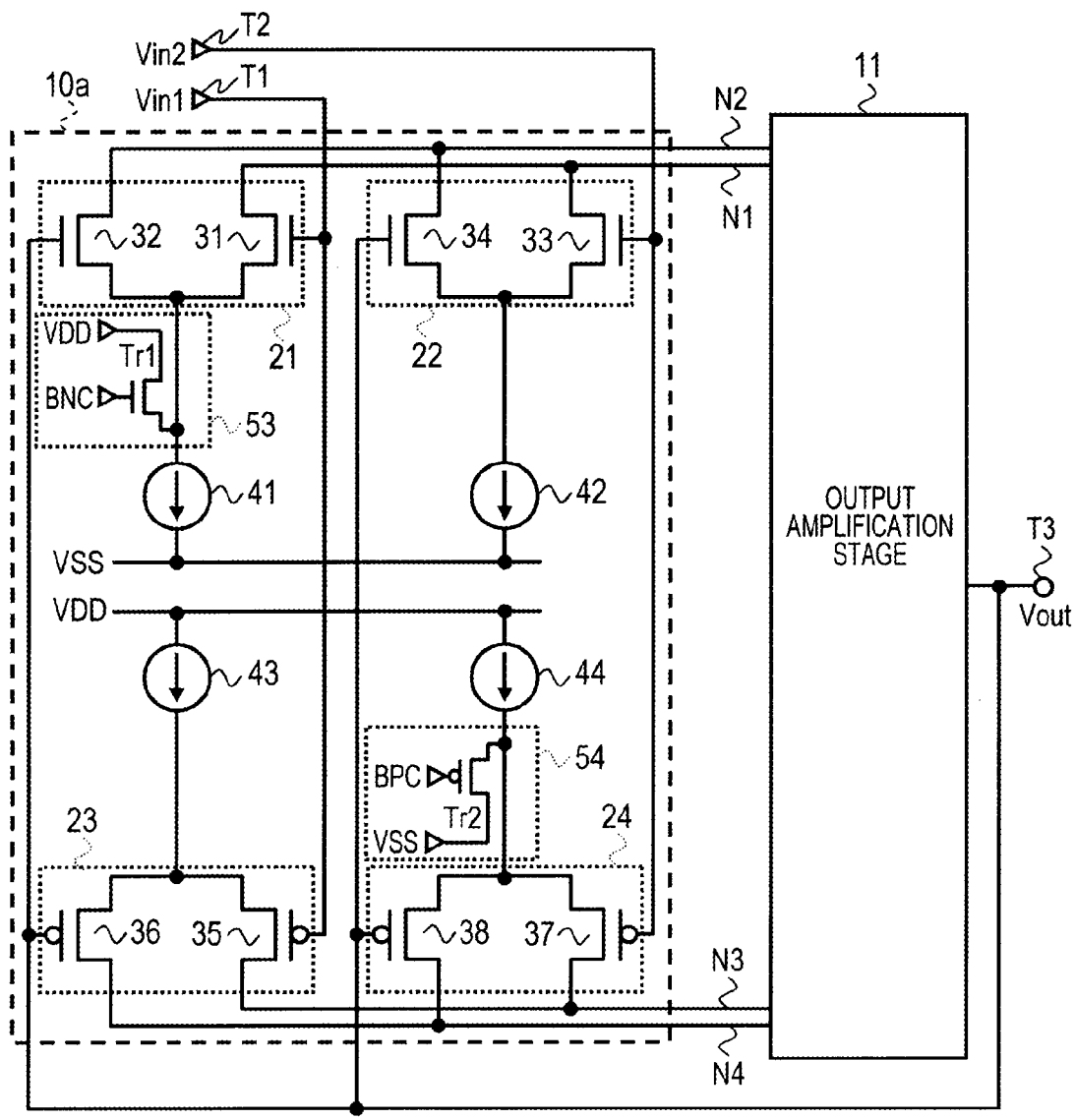
FIG. 4 is a circuit diagram of a differential amplifier according to a second embodiment of the present invention.

FIG. 4 is a circuit diagram of a differential amplifier 2 according to a second embodiment of the present invention. The differential amplifier 2 includes first and second control circuits 53 and 54 which differ from the first and second control circuits 51 and 52 included in the differential amplifier 1. In FIG. 4, elements identical to those included in the differential amplifier 1 shown in FIG. 1 are denoted by the same symbols as those used in FIG. 1, and the descriptions of such elements will be omitted in the following. Also, in FIG. 4, details of the output amplification 11 are omitted for simplification. As for the magnitude relationship between the input voltages Vin1 and Vin2 inputted to the differential amplifier 2, it is assumed, as done in describing them with reference to FIG. 1, that Vin1 is either higher than or equal to Vin2. The first control circuit 53 is provided between the first differential pair 21 provided with the input voltage Vin1 and the first current source 41, the input voltage Vin1 having a larger margin of voltage difference from the first supply voltage (low potential supply voltage VSS) than the input voltage Vin2 does. The second control circuit 54 is provided between the fourth differential pair 24 provided with the input voltage Vin2 and the fourth current source 44, the input voltage Vin2 having a larger margin of voltage difference from the second supply voltage (high potential supply voltage VDD) than the input voltage Vin1 does.

The first control circuit 53 includes a first auxiliary transistor Tr1. The first auxiliary transistor Tr1 is a transistor of the first conductivity type (for example, an NMOS transistor). A first terminal (for example, source) of the first auxiliary transistor Tr1 is coupled to a first coupling node (for example, a common coupling node of the first differential pair 21) for coupling the first current source 41 and the first differential pair 21. The first auxiliary transistor Tr1 is provided with a first control voltage BNC at a control terminal (for example, gate) thereof. A second terminal (for example, drain) of the first auxiliary transistor Tr1 is coupled to a first current supply terminal (for example, power supply providing the high potential supply voltage VDD). The current flowing between the first and second terminals (drain-source current) of the first auxiliary transistor Tr1 is controlled based on the difference between the first control voltage BNC and the voltage at the first coupling node. The first auxiliary transistor Tr1 controls, when the output voltage setting is in a first operating range, the changing point at which the operating current of the differential pair 21 starts decreasing according to lowering of the input voltages Vin1 and Vin2. To be concrete, when the output voltage setting is in the first operating range, the first auxiliary transistor Tr1 controls the changing point at which the operating current of the differential pair 21 starts decreasing by controlling, based on the first control voltage BNC, the lower limit voltage for the common source terminal of the first differential pair 21.

The first control voltage BNC is set to such a value which causes the changing point at which the current (I (31)+I (32)) flowing through the first differential pair 21 starts decreasing below the current value set at the current source 41 to approach the changing point at which, as the input voltages Vin1 and Vin2 having a predetermined voltage difference ΔV (>0) therebetween drop, the current (I (33)+I (34)) flowing through the second differential pair 22 starts decreasing below the current value set at the current source 42. When the first auxiliary transistor Tr1 includes an NMOS transistor, the lower limit voltage for the common source terminal of the first differential pair 21 can be defined as a voltage at which the drain-source current, based on the difference between the first control voltage BNC and the common source terminal voltage of the first differential pair 21, of the NMOS transistor Tr1 equals the current value set at the current source 41. The changing point for the operating current of the first differential pair 21 is controlled corresponding to the lower limit voltage control for the common source terminal of the first differential pair 21. The changing points at which the amounts of currents flowing through the first and second differential pairs 21 and 22, respectively, start decreasing need not necessarily agree with each other. The control to be performed is desired to cause, with the input voltages Vin1 and Vin2 differing from each other by a predetermined voltage difference ΔV, the changing points at which the amounts of currents flowing through the first and second differential pairs 21 and 22, respectively, start decreasing to come adequately close to each other.

The second control circuit 54 includes a second auxiliary transistor Tr2. The second auxiliary transistor Tr2 is a transistor of the second conductivity type (for example, a PMOS transistor). A first terminal (for example, source) of the second auxiliary transistor Tr2 is coupled to a second coupling node (for example, a common coupling node of the fourth differential pair 24) for coupling the fourth current source 44 and the fourth differential pair 24. The second auxiliary transistor Tr2 is provided with a second control voltage BPC at a control terminal (for example, gate) thereof. A second terminal (for example, drain) of the second auxiliary transistor Tr2 is coupled to a second current supply terminal (for example, power supply providing the low potential supply voltage VSS). The current flowing between the first and second terminals (drain-source current) of the second auxiliary transistor Tr2 is controlled based on the difference between the second control voltage BPC and the voltage at the second coupling node. The second auxiliary transistor Tr2 controls, when the output voltage setting is in a second operating range, the changing point at which the operating current of the differential pair 24 starts decreasing according to rising of the input voltages Vin1 and Vin2. To be concrete, when the output voltage setting is in the second operating range, the second auxiliary transistor Tr2 controls the changing point at which the operating current of the differential pair 24 starts decreasing by controlling, based on the second control voltage BPC, the upper limit voltage for the common coupling node of the fourth differential pair 24.

The second control voltage BPC is set to such a value which causes the changing point at which the current (I (37)+I (38)) flowing through the fourth differential pair 24 starts decreasing below the current value set at the current source 44 to approach the changing point at which, as the input voltages Vin1 and Vin2 having a predetermined voltage difference ΔV (>0) therebetween rise, the current (I (35)+I (36)) flowing through the third differential pair 23 starts decreasing below the current value set at the current source 43. When the second auxiliary transistor Tr2 includes a PMOS transistor, the upper limit voltage for the common source terminal of the fourth differential pair 24 can be defined as a voltage at which the drain-source current, based on the difference between the second control voltage BPC and the common source terminal voltage of the fourth differential pair 24, of the PMOS transistor Tr2 equals the current value set at the current source 44. The changing point for the operating current of the fourth differential pair 24 is controlled corresponding to the higher limit voltage control for the common source terminal of the fourth differential pair 24. The changing points at which the amounts of currents flowing through the third and fourth differential pairs 23 and 24, respectively, start decreasing need not necessarily agree with each other. The control to be performed is desired to cause, with the input voltages Vin1 and Vin2 differing from each other by a predetermined voltage difference ΔV, the changing points at which the amounts of currents flowing through the third and fourth differential pairs 23 and 24, respectively, start decreasing to come adequately close to each other.

Figure 5:
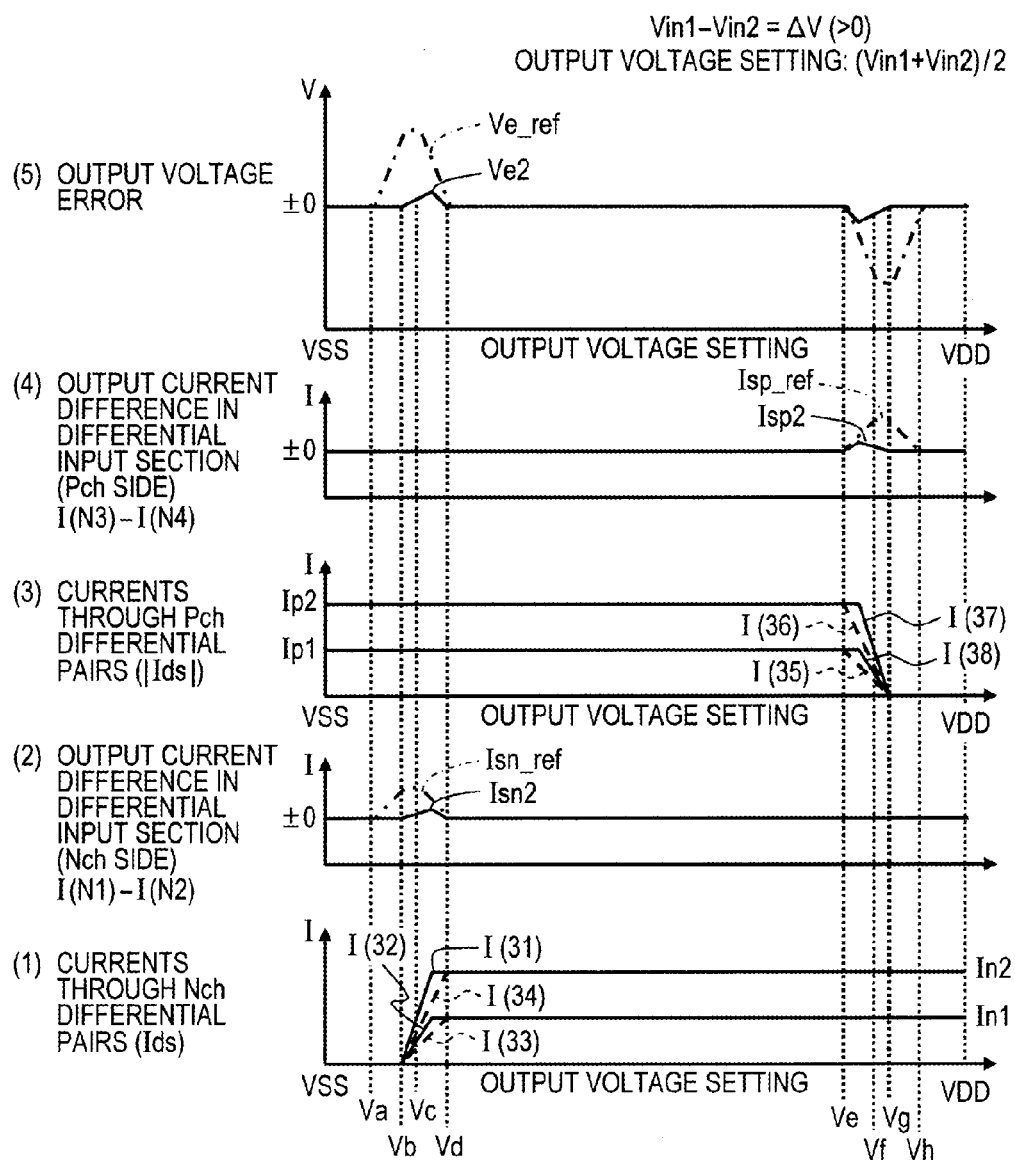
FIG. 5 shows graphs representing steady-state characteristics of the output voltage setting and output voltage error of the differential amplifier of the second embodiment.
Figure 6:
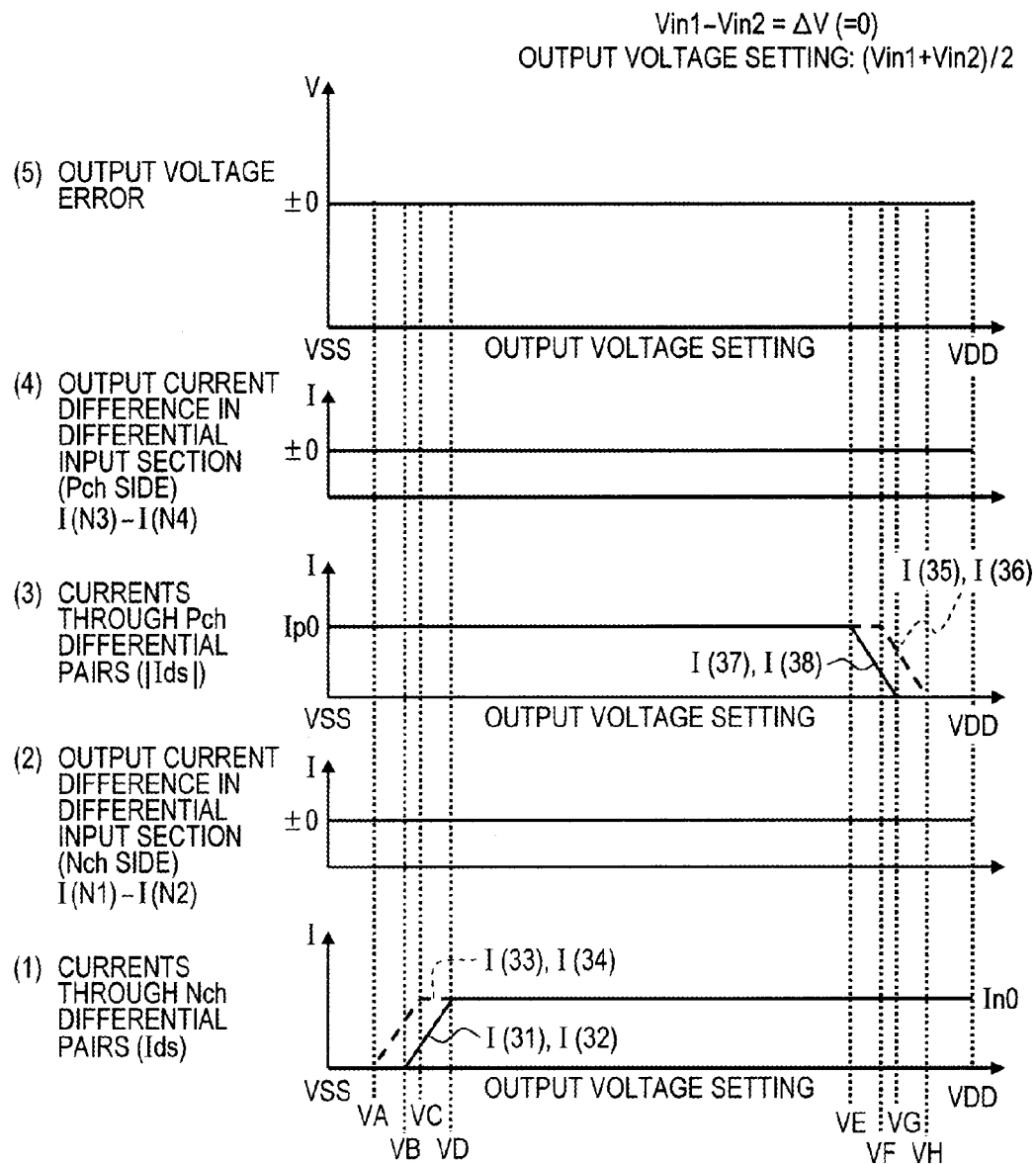
FIG. 6 shows graphs representing steady-state characteristics of the output voltage setting and output voltage error of the differential amplifier of the second embodiment.

The mechanism of suppressing the output voltage error performed by the first and second control circuits 53 and 54 included in the differential amplifier 2 shown in FIG. 4 will be described below with reference to FIGS. 5 and 6. FIGS. 5 and 6 are diagrams for describing the operation of the differential amplifier 2 shown in FIG. 4. In the differential amplifier 2 shown in FIG. 4, as in the differential amplifier 1 shown in FIG. 1, the input voltage Vin1 is either higher than or equal to the input voltage Vin2. In either case, operation is performed to suppress the increase in output voltage error in a range of output voltage setting near a supply voltage.

First, how the output voltage error is suppressed when the input voltages Vin1 and Vin2 differ from each other will be described below with reference to FIG. 5. In the example shown in FIG. 5, the input voltage Vin1 is set to be higher than the input voltage Vin2 by a voltage difference ΔV (>0). When, in the differential amplifier 2 shown in FIG. 4, interpolation is normally performed, the first and second differential pairs 21 and 22 satisfy the equivalent relationships represented by the foregoing equations (7) and (8) of the output amplifier 188 (shown in FIG. 10) based on the related technology. When the input voltage Vin1 is higher in potential than the input voltage Vin2, the currents I (31) and I (34) are larger than the currents I (32) and I (33). The currents I (31) to I (34) are related as follows: I (31)=I (34)=In2; and I (32)=I (33)=In1; where In2>In1. The total current (In2+In1) corresponds to the current values outputted from the current sources 41 and 42 (outputting equal currents). The third and fourth differential pairs 23 and 24 also maintain similar current relationships. Namely, when, with the input voltage Vin1 being higher in potential than the input voltage Vin2, interpolation is performed normally, the currents I (37) and I (36) are larger than the currents I (35) and I (38), and the currents I (35) to I (38) are related as follows: I (37)=I (36)=Ip2; and I (35)=I (38)=Ip1; where Ip2>Ip1. The total current (Ip2+Ip1) corresponds to the current values outputted from the current sources 43 and 44 (outputting equal currents). The current values in the third and fourth differential pairs 23 and 24 are represented by absolute values of their drain-to-source currents. To make comparison easy between the characteristics of the differential amplifier 2 shown in FIG. 4 and the characteristics (shown in FIG. 12) of the output amplifier 188 (shown in FIG. 10) based on related technology, the characteristics shown in parts (2), (4) and (5) of FIG. 12 are also shown, in chain line, in parts (2), (4) and (5) of FIG. 5.

In FIG. 5, part (1) represents the characteristics of currents flowing through the first and second differential pairs 21 and 22, respectively. In part (1), currents I (31) and I (32) are represented by solid lines and currents I (33) and I (34) are represented by broken lines. When the output voltage setting is in a range near the high potential supply voltage VDD, the currents I (31) and I (34) flowing through the first and second differential pairs 21 and 22, respectively, are kept at In2, and the currents I (32) and I (33) flowing through the first and second differential pairs 21 and 22, respectively, are kept at In1. In this state, interpolation by the first and second differential pairs 21 and 22 is performed normally. When, with the output voltage setting being in a range near the low potential supply voltage VSS, the input voltages Vin1 and Vin2 lower causing the output voltage setting to reach Vd, the common source terminal of the second differential pair 22 provided with the low potential input voltage Vin2 reaches the low potential supply voltage VSS. When the output voltage setting further lowers, the gate-source voltages of the transistors 33 and 34 included in the second differential pair 22 lower. Subsequently, as the output voltage setting drops below Vd, the currents I (33) and I (34) start decreasing. When the output voltage setting further drops to Vb, the currents I (33) and I (34) become almost zero causing the second differential pair 22 to stop. The first operating range is where the output voltage setting ranges from voltage Vd to VSS.

For the common source terminal of the first differential pair 21 provided with the input voltage Vin1, the lower limit voltage is controlled by the control voltage BNC of the first auxiliary transistor Tr1. The control voltage BNC is set to a lower limit voltage which, in the first operating range, causes the changing point at which the operating current of the first differential pair 21 starts decreasing to approach the changing point (Vd) at which the operating current of the second differential pair 22 starts decreasing. In the example shown in FIG. 5, the changing point at which the operating current of the first differential pair 21 starts decreasing is set to be around voltage Vd. When the input voltages Vin1 and Vin2 lower causing the output voltage setting to drop to voltage Vd, the voltage at the common source terminal of the first differential pair 21 reaches the lower limit voltage controlled by the first auxiliary transistor Tr1. When the output voltage setting further drops, the gate-source voltages of the transistors 31 and 32 included in the first differential pair 21 drop. Subsequently, as the output voltage setting drops below voltage Vd, the currents I (31) and I (32) start decreasing. When the output voltage setting drops to voltage Vb, the currents I (31) and I (32) become almost zero causing the first differential pair 21 to stop. Namely, with the first auxiliary transistor Tr1 provided, the changing point at which the currents flowing through the transistor pair included in the first differential pair 21 starts decreasing can be approximately equalized with the changing point (Vd) at which the currents flowing through the transistor pair included in the second differential pair 22 start decreasing.

In FIG. 5, part (2) represents the characteristic (characteristic curve Isn2) of the output current difference between the current nodes N1 and N2 (I (N1)–I (N2)) in the differential input section 10. The output current I (N1) is the sum of the currents I (31) flowing through the first differential pair 21 and I (33) flowing through the second differential pair 22, and the output current I (N2) is the sum of the currents I (32) flowing through the first differential pair 21 and I (34) flowing through the second differential pair 22. The output currents I (N1) and I (N2) are combined with the currents flowing through the output side node and input side node, respectively, of the current mirror 60 included in the output amplification section 11. Normally, when interpolation is normally performed based on the steady-state characteristics, the output current difference (I (N1)–I (N2)) is zero. Referring to part (2) of FIG. 5, the output current difference (I (N1)–I (N2)) dependent on changes in the currents flowing through the first and second differential pairs 21 and 22, respectively, is zero on the high potential supply voltage VDD side. Though, the output current difference (I (N1)–I (N2)) slightly increases in the positive direction in the output voltage setting range of voltage Vd to voltage Vb on the low potential supply voltage VSS side, the increase is adequately small.

Referring to part (2) of FIG. 5, thanks to the current characteristic in the first operating range of the first differential pair 21 affected by the first auxiliary transistor Tr1, the increase (represented in solid line) in the output current difference (I (N1)–I (N2)) is much smaller than the increase (represented, in FIG. 5, by characteristic curve Isn_ref in chain line) in the output current difference (I (N1)–I (N2)) (shown in part (2) of FIG. 12) in the amplifier using the related-art technology.

In the foregoing description of the related-art technology made with reference to FIG. 12, it has been stated that, when the output current difference (I (N1)–I (N2)) increases in the positive direction, the output voltage error correspondingly increases toward a higher potential (in the positive direction). Referring to part (5) of FIG. 5, even though the output voltage error (characteristic curve Ve2) slightly increases to a higher potential (in the positive direction) corresponding to the increase in the output current difference (I (N1)–I (N2)) represented by the characteristic curve (Isn2) in part (2) of FIG. 5, the output voltage error is much smaller than the output voltage error based on the related-art technology (represented, in FIG. 5, by characteristic curve Ve_ref in chain line) shown in part (5) of FIG. 12.

In FIG. 5, part (3) represents the characteristics of currents flowing through the third and fourth differential pairs 23 and 24, respectively. In part (3), currents I (37) and I (38) are represented by solid lines and currents I (35) and I (36) are represented by broken lines. When the output voltage setting is in a range near the low potential supply voltage VSS, the currents I (35) and I (38) flowing through the third and fourth differential pairs 23 and 24, respectively, are kept at Ip1, and the currents I (36) and I (37) flowing through the third and fourth differential pairs 23 and 24, respectively, are kept at Ip2. In this state, interpolation by the third and fourth differential pairs 23 and 24 is performed normally. When, with the output voltage setting being in a range near the high potential supply voltage VDD, the input voltages Vin1 and Vin2 rise causing the output voltage setting to reach Ve, the common source terminal of the third differential pair 23 provided with the high potential input voltage Vin1 reaches the high potential supply voltage VDD. When the output voltage setting further rises, the gate-source voltages of the transistors 35 and 36 included in the third differential pair 23 lower (in absolute value). Subsequently, as the output voltage setting rises above Ve, the currents I (35) and I (36) start decreasing. When the output voltage setting further rises to Vg, the currents I (35) and I (36) become almost zero causing the third differential pair (35, 36) to stop. The second operating range is where the output voltage setting ranges from voltage Ve to VDD. Voltage Ve is the changing point at which the operating current of the third differential pair 23 starts decreasing.

For the common source terminal of the fourth differential pair 24 provided with the input voltage Vin2, the upper limit voltage is controlled by the control voltage BPC of the second auxiliary transistor Tr2. The control voltage BPC is set to an upper limit voltage which, in the second operating range, causes the changing point at which the operating current of the fourth differential pair 24 starts decreasing to approach the changing point (Ve) at which the operating current of the third differential pair 23 starts decreasing. In the example shown in FIG. 5, the changing point at which the operating current of the fourth differential pair 24 starts decreasing is set to be around voltage Ve. When the input voltages Vin1 and Vin2 rise causing the output voltage setting to rise to voltage Ve, the voltage at the common source terminal of the fourth differential pair 24 reaches the upper limit voltage controlled by the second auxiliary transistor Tr2. When the output voltage setting further rises, the gate-source voltages of the transistors 37 and 38 included in the fourth differential pair 24 lower. Subsequently, as the output voltage setting rises above voltage Ve, the currents I (37) and I (38) start decreasing. When the output voltage setting rises to voltage Vg, the currents I (37) and I (38) become almost zero causing the fourth differential pair 24 to stop. Namely, with the second auxiliary transistor Tr2 provided, the changing point at which the currents flowing through the transistor pair included in the fourth differential pair 24 start decreasing can be approximately equalized with the changing point (Ve) at which the currents flowing through the transistor pair included in the third differential pair 23 start decreasing.

In FIG. 5, part (4) represents the characteristic (characteristic curve Isp2) of the output current difference between the current nodes N3 and N4 (I (N3)−I (N4)) in the differential input section 10. The output current I (N3) is the sum of the currents I (35) flowing through the third differential pair 23 and I (37) flowing through the fourth differential pair 24, and the output current I (N4) is the sum of the currents I (36) flowing through the third differential pair 23 and I (38) flowing through the fourth differential pair 24. The output currents I (N3) and I (N4) are respectively combined with the currents flowing through the output side node and input side node, respectively, of the current mirror 80 included in the output amplification section 11. Normally, when interpolation is normally performed based on the steady-state characteristics, the output current difference (I (N3)−I (N4)) is zero. Referring to part (4) of FIG. 5, the output current difference (I (N3)−I (N4)) dependent on changes in the currents flowing through the p-channel differential pairs shown in part (3) of FIG. 5 is zero on the low potential supply voltage VSS side. Though, the output current difference (I (N3)−I (N4)) slightly increases in the positive direction in the output voltage setting range of voltage Ve to Vg on the high potential supply voltage VDD side, the increase is adequately small.

Referring to part (4) of FIG. 5, thanks to the current characteristic in the second operating range of the fourth differential pair 24 affected by the second auxiliary transistor Tr2, the increase (represented in solid line) in the output current difference (I (N3)−I (N4)) is much smaller than the increase (represented, in FIG. 5, by characteristic curve Isp_ref in chain line) in the output current difference (I (N3)−I (N4)) (shown in part (4) of FIG. 12) in the amplifier using the related-art technology.

In the foregoing description of the related-art technology made with reference to FIG. 12, it has been stated that, when the output current difference (I (N3)−I (N4)) increases in the positive direction, the output voltage error correspondingly increases toward a lower potential (in the negative direction). Referring to part (4) of FIG. 5, even though the output voltage error (characteristic curve Ve2) increases to a lower potential (in the negative direction) corresponding to the increase in the output current difference (I (N3)−I (N4)) represented by the characteristic curve (Isp2) in part (4) of FIG. 5, the output voltage error is much smaller than the output voltage error based on the related-art technology (represented, in FIG. 5, by characteristic curve Ve_ref in chain line) shown in part (5) of FIG. 12.

Figure 10:
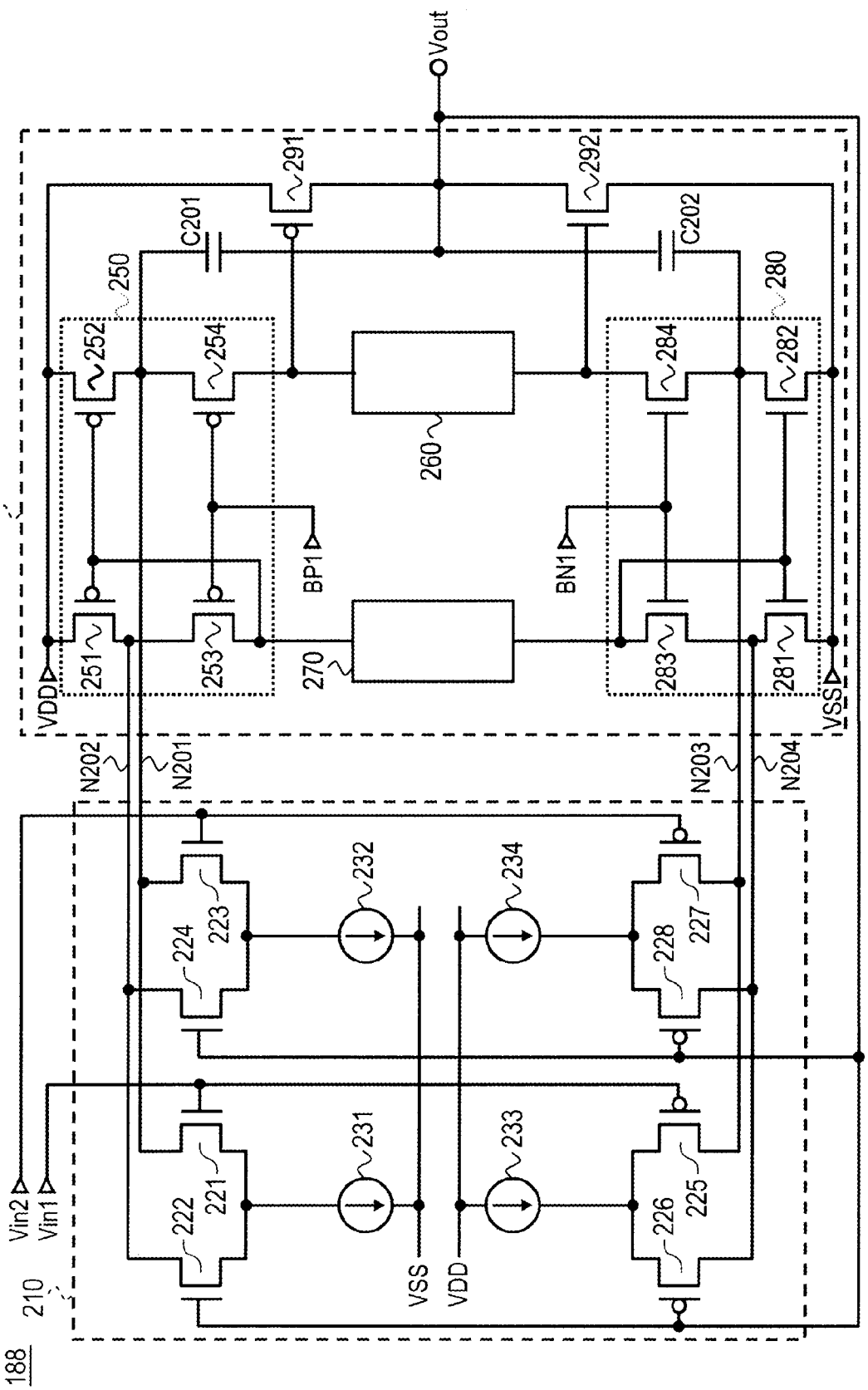
FIG. 10 is a circuit diagram of the output amplifier disclosed in Japanese Patent Laid-Open No. 2006-050296.
Figure 11:
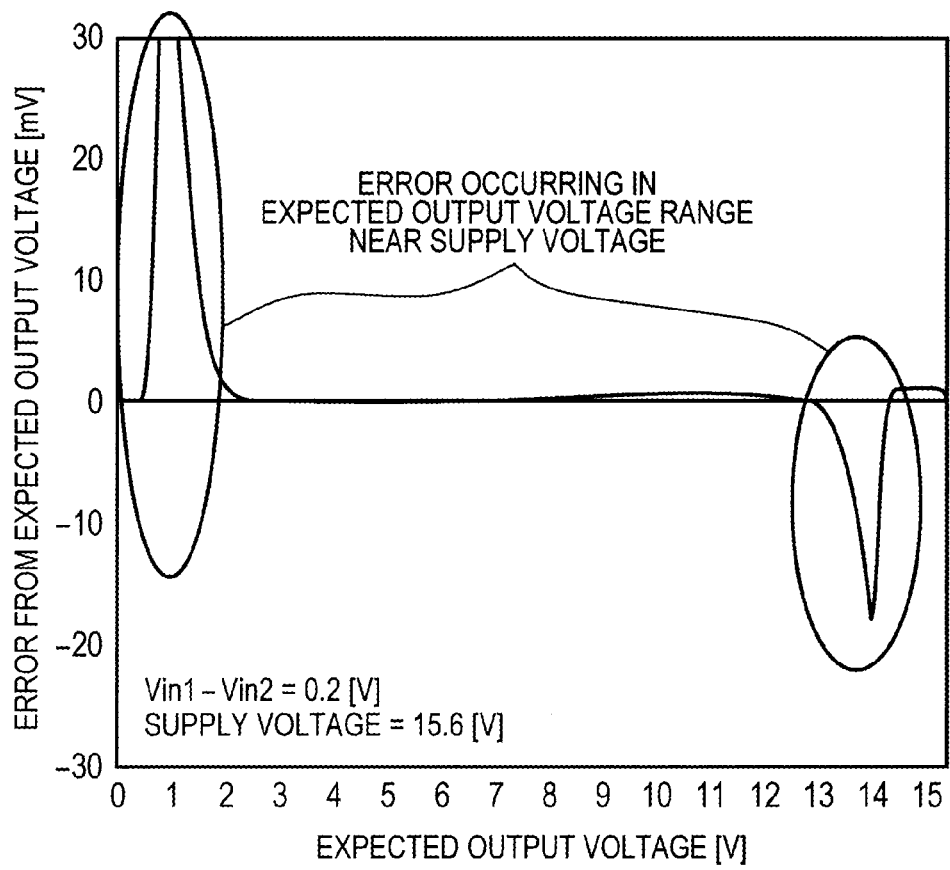
FIG. 11 is a graph showing a steady-state characteristic of expected output voltage versus output voltage error of the output amplifier disclosed in Japanese Patent Laid-Open No. 2006-050296.

As described above, in cases where the two input voltages Vin1 and Vin2 differ from each other, with the first and second auxiliary transistors Tr1 and Tr2 provided, the increase in the output current difference in the differential input section 10 of the differential amplifier 2 shown in FIG. 4 can be held adequately small in the first and second operating ranges thereby largely decreasing the increase in the output voltage error as compared with the case of the amplifier using the related-art technology (shown in FIG. 10).

Next, the operation performed when the input voltages Vin1 and Vin2 for the differential amplifier 2 shown in FIG. 4 are equal ($\Delta V=0$) will be described with reference to FIG. 6. When the input voltages Vin1 and Vin2 are equal, the output voltage Vout=Vin1 (Vin2), and the currents I (31) and I (32) flowing through the first differential pair 21 and the currents I (33) and I (34) flowing through the second differential pair 22 become equal. In the following, the currents I (31) to I (34) flowing when the operating currents set by the current sources 41 and 42 flow through the differential pairs 21 and 22 will be referred to as "current In0." Also, the currents I (35) and I (36) flowing through the third differential pair 23 and the currents I (37) and I (38) flowing through the fourth differential pair 24 become equal. In the following, the currents I (35) to I (38) flowing when the operating currents set by the current sources 43 and 44 flow through the differential pairs 23 and 24 will be referred to as "current Ip0."

In FIG. 6, part (1) represents the characteristics of currents flowing through the first and second differential pairs 21 and 22, respectively. In part (1), currents I (31) and I (32) are represented by solid lines and currents I (33) and I (34) are represented by broken lines. When the output voltage setting is on the high potential supply voltage VDD side, the currents I (31) to I (34) flowing through the first differential pair 21 and second differential pair 22 are kept at In0. When, with the output voltage setting being in a range near the low potential supply voltage VSS, the input voltage Vin1 (Vin2) lowers causing the output voltage setting (=Vin1) to drop to voltage VD, the voltage at the common source terminal of the first differential pair 21 reaches the lower limit voltage controlled by the first auxiliary transistor Tr1. When the output voltage setting further drops, the gate-source voltages of the transistors 31 and 32 included in the first differential pair 21 also decrease. Subsequently, as the output voltage setting drops below voltage VD, the currents I (31) and I (32) start decreasing. When the output voltage setting reaches voltage VB, the currents I (31) and I (32) become almost zero causing the first differential pair 21 to stop. When the input voltages Vin1 and Vin2 are equal, the first operating range is where the output voltage setting ranges from voltage VD to the low potential supply voltage VSS.

When the input voltage Vin1 (Vin2) lowers causing the output voltage setting (=Vin1) to drop to voltage VC, the voltage at the common source terminal of the second differential pair 22 drops to the low potential supply voltage VSS. When the output voltage setting further drops, the gate-source voltages of the transistors 33 and 34 of the second differential pair 22 decrease. Subsequently, as the output voltage setting drops below voltage VC, the currents I (33) and I (34) start decreasing. When the output voltage setting reaches voltage VA, the currents I (33) and I (34) become almost zero causing the second differential pair 22 to stop. Namely, with the first auxiliary transistor Tr1 provided, the voltage VD at which the currents flowing through the transistor pair included in the first differential pair 21 start decreasing is shifted to a higher potential than the voltage VC at which the currents flowing through the second differential pair 22 starts decreasing. The voltage VB at which the first differential pair 21 stops is also shifted to a higher potential than the voltage VA at which the second differential pair 22 stops.

In FIG. 6, part (2) represents the characteristic of the output current difference between the current nodes N1 and N2 (I (N1)–I (N2)) in the differential input section 10. The output current difference (I (N1)–I (N2)) depends on changes in the currents flowing through the first and second differential pairs 21 and 22, respectively, as shown in part (1) of FIG. 6. Referring to part (1) of FIG. 6, the currents I (31) and I (32) and the currents I (33) and I (34) decrease differently when the output voltage setting is in the range of voltage VD to VA. Since, however, the relationships of I (31)=I (32) and I (33)=I (34) are maintained, the output current difference (I (N1)–I (N2)) does not increase. Hence, the output voltage error shown in part (5) of FIG. 6 corresponding to the characteristic of the output current difference (I (N1)–I (N2)) shown in part (2) of FIG. 6 does not increase even when the output voltage setting is near the low potential supply voltage VSS.

In FIG. 6, part (3) represents the characteristics of the currents flowing through the third and fourth differential pairs 23 and 24, respectively. In part (3) of FIG. 6, the currents I (37) and I (38) are represented by solid lines, and the currents I (35) and I (36) are represented by broken lines. When the output voltage setting is in a range on the low potential supply voltage VSS side, the currents I (31) to I (34) flowing through the third differential pair 23 or fourth differential pair 24 are kept at Ip0. When, with the output voltage setting being in a range near the high potential supply voltage VDD, the input voltage Vin1 (Vin2) rises causing the output voltage setting (=Vin1) to rise to voltage VE, the voltage at the common source terminal of the fourth differential pair 24 reaches the upper limit voltage controlled by the second auxiliary transistor Tr2. When the output voltage setting further rises, the gate-source voltages of the transistors 37 and 38 included in the fourth differential pair 24 decrease. Subsequently, as the output voltage setting rises above voltage VE, the currents I (37) and I (38) start decreasing. When the output voltage setting reaches voltage VG, the currents I (37) and I (38) become almost zero causing the fourth differential pair 24 to stop. When the input voltages Vin1 and Vin2 are equal, the second operating range is where the output voltage setting ranges from voltage VE to the high potential supply voltage VDD.

When the input voltage Vin1 (Vin2) rises causing the output voltage setting (=Vin1) to rise to voltage VF, the voltage at the common source terminal of the third differential pair 23 rises to the high potential supply voltage VDD. When the output voltage setting further rises, the gate-source voltages of the transistors 35 and 36 of the third differential pair 23 decrease. Subsequently, as the output voltage setting rises above voltage VF, the currents I (35) and I (36) start decreasing. When the output voltage setting reaches voltage VH, the currents I (35) and I (36) become almost zero causing the third differential pair 23 to stop. Namely, with the second auxiliary transistor Tr2 provided, the voltage VE at which the currents flowing through the transistor pair included in the fourth differential pair 24 start decreasing is shifted to a lower potential than the voltage VF at which the currents flowing through the third differential pair 23 start decreasing. The voltage VG at which the fourth differential pair 24 stops is also shifted to a lower potential than the voltage VH at which the third differential pair 23 stops.

In FIG. 6, part (4) represents the characteristic of the output current difference between the current nodes N3 and N4 (I (N3)–I (N4)) in the differential input section 10. The output current difference (I (N3)–I (N4)) depends on changes in the currents flowing through the third and fourth differential pairs 23 and 24, respectively, shown in part (3) of FIG. 6. Referring to part (3) of FIG. 6, the currents I (35) and I (36) and the currents I (37) and I (38) decrease differently when the output voltage setting is in the range of voltage VE to VH. Since, however, the relationships of I (35)=I (36) and I (37)=I (38) are maintained, the output current difference (I (N3)–I (N4)) does not increase. Hence, the output voltage error shown in part (5) of FIG. 6 corresponding to the characteristic of the output current difference (I (N3)–I (N4)) shown in part (4) of FIG. 6 does not increase even when the output voltage setting is near the high potential supply voltage VDD.

It has been described above that, in cases where the input voltages Vin1 and Vin2 are equal, the first and second auxiliary transistors Tr1 and Tr2 do not cause any increase either in the difference between the output currents of the differential input section 10 included in the differential amplifier 2 shown in FIG. 4 or in the output voltage error of the differential amplifier 2.

As described above, in the differential amplifier 2 according to the second embodiment, the first and second control circuits 53 and 54 configured differently from the control circuits used in the first embodiment decrease the output voltage error when the output voltage setting is near a supply voltage. Each of the first and second control circuits 53 and 54 can be configured using one transistor, so that, in the differential amplifier 2, too, as in the differential amplifier 1 of the first embodiment, the output voltage error can be reduced while suppressing circuit scale expansion.

Third Embodiment

Figure 7:
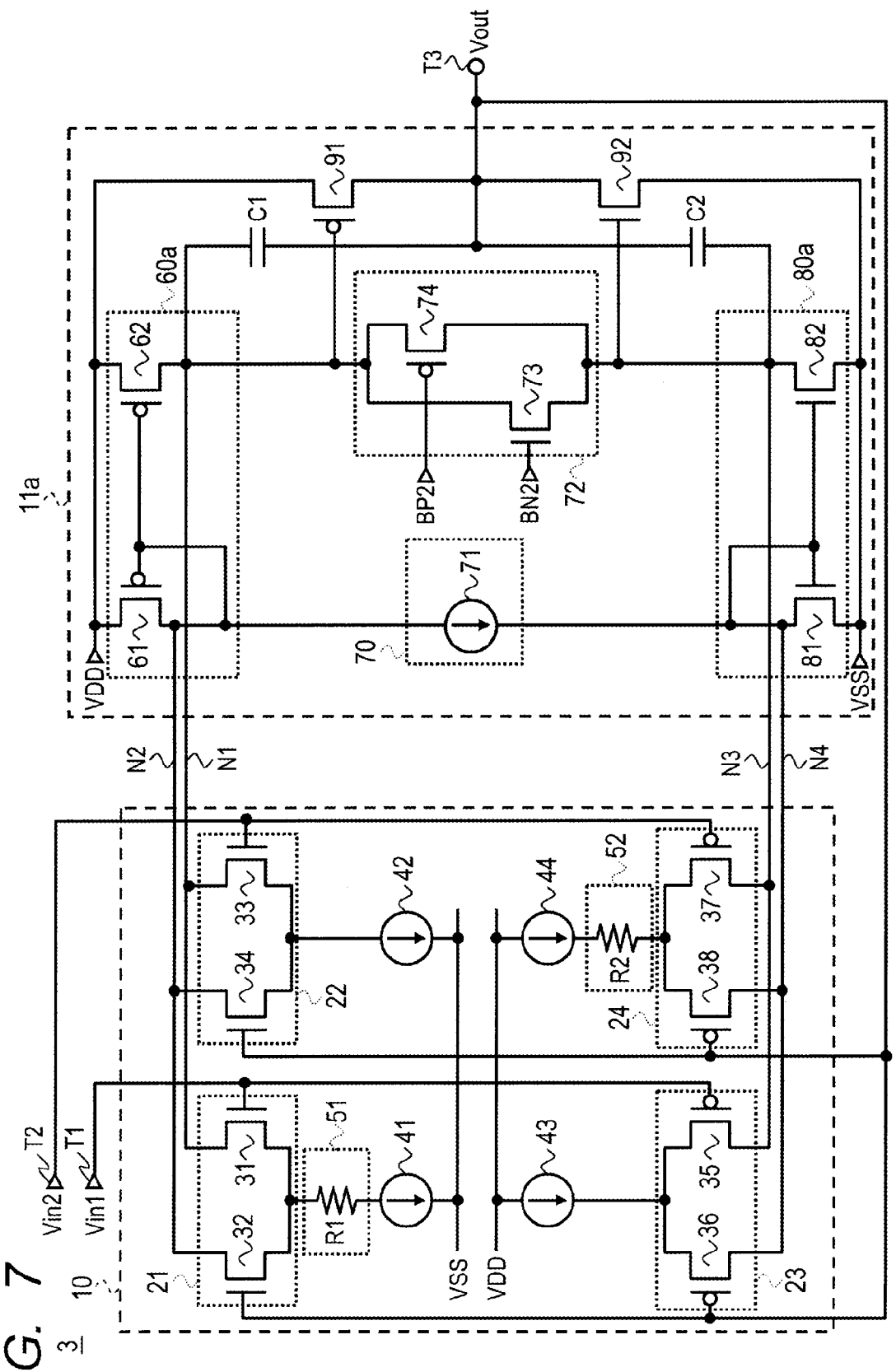
FIG. 7 is a circuit diagram of a differential amplifier according to a third embodiment of the present invention.

FIG. 7 is a circuit diagram of a differential amplifier 3 according to a third embodiment of the present invention. As shown in FIG. 7, the differential amplifier 3 includes an output amplification section 11a configured differently from the output amplification section 11. In FIG. 7, elements identical to those included in the differential amplifier 1 of the first embodiment shown in FIG. 1 are denoted by the same symbols as those used in FIG. 1, and the descriptions of such elements will be omitted in the following.

The output amplification section 11a includes first and second current mirrors 60a and 80a instead of the first and second current mirrors 60 and 80 of the output amplification section 11. The first current mirror 60a is equivalent to the first current mirror 60 less the PMOS transistors 63 and 64. The second current mirror 80a is equivalent to the second current mirror 80 less the NMOS transistors 83 and 84.

To be more concrete, the first current mirror 60a includes a first transistor pair of the second conductivity type coupled to a second power supply (for example, a high potential power supply). The first transistor pair is coupled with the first current node pair (N1, N2), and the first current mirror 60a receives the differential currents outputted from the first current node pair (N1, N2). The first transistor pair includes a first mirror transistor (for example, a PMOS transistor 61) and a second mirror transistor (for example, a PMOS transistor 62).

First terminals (for example, sources) of the PMOS transistors 61 and 62 are commonly coupled to the high potential power supply, and their control terminals (for example, gates) are commonly coupled. A node (for example, the current node N1) included in the first current node pair (N1, N2) is coupled to a second terminal (for example, drain) of the PMOS transistor 62. The other node (for example, the current node N2) included in the first current node pair (N1, N2) is coupled to a second terminal (for example, drain) of the PMOS transistor 61. The drain of the PMOS transistor 61 is used as the input node for the first current mirror 60a and is coupled to the gate of the PMOS transistor 61. The drain of the PMOS transistor 62 is used as the output node for the first current mirror 60a.

The second current mirror 80a includes a second transistor pair of the first conductivity type coupled to a first power supply (for example, a low potential power supply). The second transistor pair is coupled with the second current node pair (N3, N4), and the second current mirror 80a receives the differential currents outputted from the second current node pair (N3, N4). The second transistor pair includes a third mirror transistor (for example, an NMOS transistor 81) and a fourth mirror transistor (for example, an NMOS transistor 82).

First terminals (for example, sources) of the NMOS transistors 81 and 82 are commonly coupled to the low potential power supply, and their control terminals (for example, gates) are commonly coupled. A node (for example, the current node N3) included in the second current node pair (N3, N4) is coupled to a second terminal (for example, drain) of the NMOS transistor 82. The other node (for example, the current node N4) included in the second current node pair (N3, N4) is coupled to a second terminal (for example, drain) of the PMOS transistor 81. The drain of the NMOS transistor 81 is used as the input node for the second current mirror 80a and is coupled to the gate of the NMOS transistor 81. The drain of the NMOS transistor 82 is used as the output node for the second current mirror 80a.

The output amplification section 11a configured as described above can operate similarly to the output amplification section 11. Since the output amplification section 11a includes fewer circuit elements than the output amplification section 11, the number of circuit elements included in the differential amplifier 3 using the output amplification section 11a can be made smaller than that included in the differential amplifier 1. The differential input section 10 of the differential amplifier 3 is configured identically to the differential input section 10 of the differential amplifier 1, so that the output voltage error of the differential amplifier 3 can be suppressed as done for the differential amplifier 1. The differential input section 10 of the differential amplifier 3 shown in FIG. 7 may be replaced by the differential input section 10a of the differential amplifier 2 (shown in FIG. 4).

Fourth Embodiment

Figure 8:
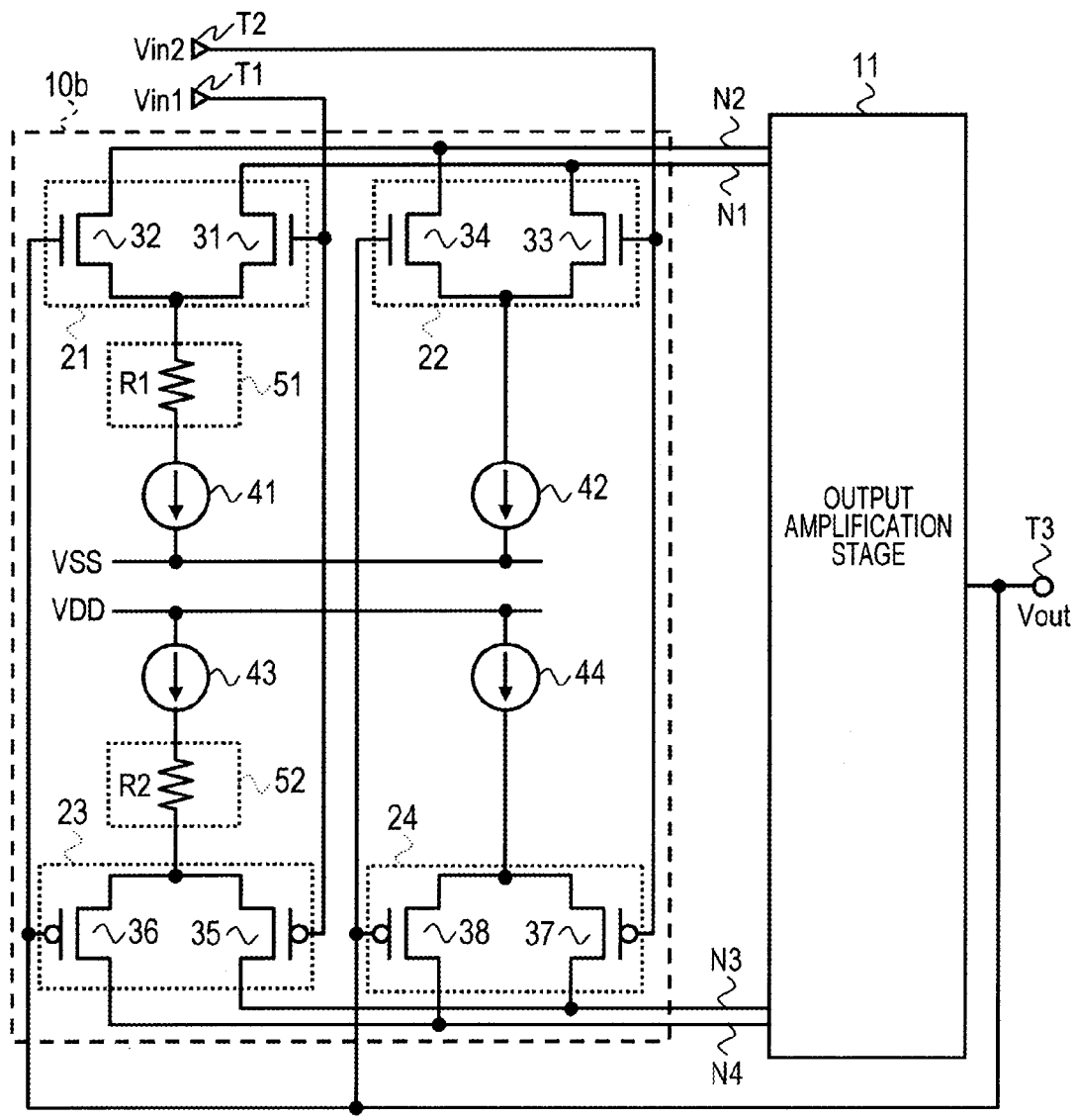
FIG. 8 is a circuit diagram of a differential amplifier according to a fourth embodiment of the present invention.

FIG. 8 is a circuit diagram of a differential amplifier 4 according to a fourth embodiment of the present invention. In FIG. 8, elements identical to those included in the differential amplifier 1 of the first embodiment shown in FIG. 1 are denoted by the same symbols as those used in FIG. 1, and the descriptions of such elements will be omitted in the following.

As shown in FIG. 8, the differential amplifier 4 includes a differential input section 10b instead of the differential input section 10 included in the differential amplifier 1 of the first embodiment. The position of the second control circuit 52 differs between the differential input section 10b and the differential input section 10.

With the differential input section 10b configured as shown in FIG. 8 and operating in a first operating range in which the output voltage setting is near the low potential supply voltage VSS, when the input voltages Vin1 and Vin2 for the differential input section 10b differ from each other, Vin1 is higher than Vin2 (Vin1>Vin2). When the input voltages Vin1 and Vin2 differ from each other with the differential input section 10b operating in a second operating range in which the output voltage setting is near the high potential supply voltage VDD, Vin1 is lower than Vin2 (Vin1<Vin2). Therefore, in the differential input section 10b, the first control circuit 51 is provided between the first differential pair 21 provided with the input voltage Vin1, which has a larger margin of voltage difference from the first supply voltage (low potential supply voltage VSS) than the input voltage Vin2 does, and the first current source 41 and the second control circuit 52 is provided between the third differential pair 23 provided with the input voltage Vin1, which has a larger margin of voltage difference from the second supply voltage (high potential supply voltage VDD) than the input voltage Vin2 does, and the third current source 43. Namely, in the differential input section 10b, the second control circuit 52 is provided between the third differential pair 23 and the third current source 43.

The operation of the second control circuit 52 shown in FIG. 8 can be described by interchanging, in the description of the control circuit 52 shown in FIG. 1, "Vin1" and "Vin2" and also "the third differential pair 23 (transistors 35, 36)" and "the fourth differential pair 24 (transistors 37, 38)." This makes it necessary to also interchange, the currents "I (35) and I (36)" and the currents "I (37) and I (38)" concerning the p-channel differential pairs. Namely, in part (3) of FIG. 2 and part (3) of FIG. 3, the currents I (35) and I (36) are represented in solid line and the currents I (37) and I (38) are represented in broken line after the above interchanges. Also after the above interchanges, in part (4) of FIG. 2, the direction in which the output current difference between the current nodes N3 and N4 (I (N3)−I (N4)) increases in the second operating range changes from positive to negative and, in part (5) of FIG. 2, the direction of the output voltage error in the second operating range changes from toward a lower potential (in the negative direction) to toward a high potential (in the positive direction). The operating characteristics in the first operating range remain unchanged.

In a data driver for a liquid crystal display device, in particular, an intermediate voltage between the supply voltages VDD and VSS is defined as VCOM; the voltage range between the VCOM and VDD is defined as a positive voltage range; the voltage range between VCOM and VSS is defined as a negative voltage range; and each of the positive and negative voltage ranges is divided for output as gradation voltages. In such a case, the magnitude relationship between the input voltages Vin1 and Vin2 for the differential amplifier can be determined separately for positive gradation voltages and for negative gradation voltages. Therefore, when, with the input voltages Vin1 and Vin2 differing from each other, making Vin1 higher than Vin2 (Vin1>Vin2) for both the positive and negative gradation voltages, the differential amplifier 1 of the first embodiment is used. On the other hand, when, with the input voltages Vin1 and Vin2 differing from each other, making Vin1 higher than Vin2 (Vin1>Vin2) for the positive gradation voltages while making Vin1 lower than Vin2 (Vin1<Vin2) for the negative gradation voltages, the differential amplifier 4 of the fourth embodiment is used. In all the first to fourth embodiments, the first and second control circuits 51 and 52 are provided so as to control the changing point at which the operating current from a current source starts decreasing, the current source being the one supplying an operating current to the differential pair that is provided with whichever of the input voltages Vin1 and Vin2 that has a larger margin of voltage difference, than the other one does, from the corresponding supply voltage in the first or the second operating range. The first and second control circuits 51 and 52 used in the fourth embodiment may be replaced by the first and second control circuits 53 and 54 used in the second embodiment.

Figure 9:
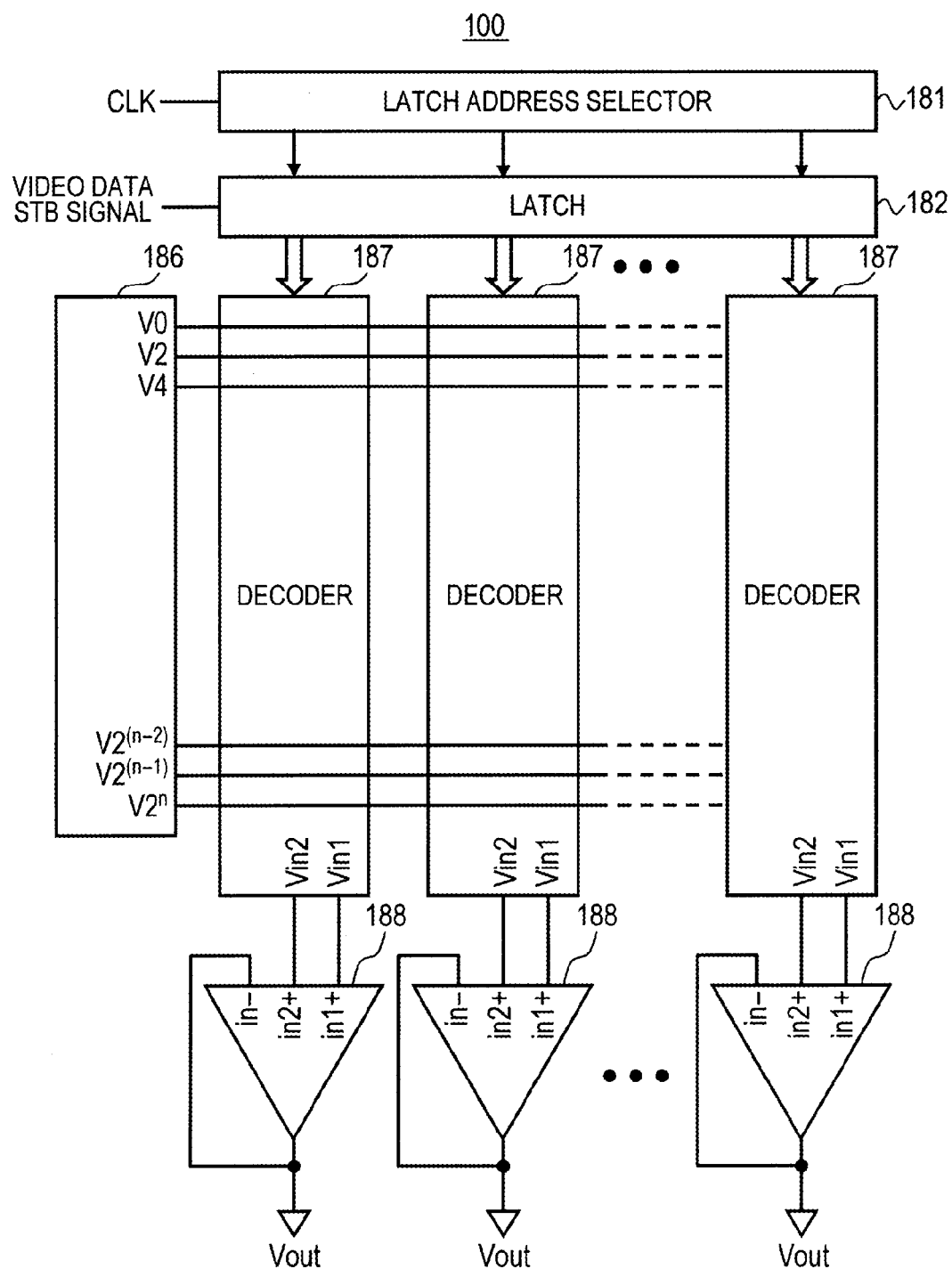
FIG. 9 is a block diagram of the data driver disclosed in Japanese Patent Laid-Open No. 2006-050296.

Differential amplifiers suitable for use in an output circuit of a data driver for driving an active matrix display device have been described by way of the first to fourth embodiments. Any of the differential amplifiers of the first to fourth embodiments can replace an output amplifier 188 used in the data driver shown in FIG. 9 so as to suppress the increase in the error of the interpolated output voltage of the differential amplifier and improve the output voltage accuracy of the differential amplifier. A data driver using the differential amplifier of any of the first to fourth embodiments can be applied to an active matrix display device (for example, a liquid crystal display device or an organic light emitting diode (OLED) display device).

The present invention is not limited to the above embodiments and can be modified in various ways without departing from the scope of the invention. The first and second connection circuits 70 and 72, for example, represent only an example of circuit configuration and the circuit configuration can be appropriately changed.

What is claimed is:

1. A differential amplifier for outputting a voltage having a signal level which is between a first input voltage and a second input voltage, the differential amplifier comprising:
   a first differential pair including transistors of a first conductivity type and outputting a first pair of differential currents to a first current node pair based on a difference between a first one of the first and second input voltages and the output voltage;
   a second differential pair including transistors of the first conductivity type and outputting a second pair of differential currents to the first current node pair based on a difference between a second one of the first and second input voltages and the output voltage;
   a third differential pair including transistors of a second conductivity type and outputting a third pair of differential currents to a second current node pair based on a difference between the first one of the first and second input voltages and the output voltage;
   a fourth differential pair including transistors of the second conductivity type and outputting a fourth pair of differential currents to the second current node pair based on a difference between the second one of the first and second input voltages and the output voltage;
   a first current source provided between a first power supply for providing a first supply voltage and the first differential pair and providing an operating current to the first differential pair;
   a second current source provided between the first power supply and the second differential pair and providing an operating current to the second differential pair;
   a third current source provided between a second power supply for providing a second supply voltage and the third differential pair and providing an operating current to the third differential pair;
   a fourth current source provided between the second power supply and the fourth differential pair and providing an operating current to the fourth differential pair;
   a first control circuit which controls, in a first operating range, a changing point at which the operating current provided to the first differential pair changes, the first operating range being where amounts of currents flowing, based on the first and second input voltages and the output voltage, through the first and second differential pairs, respectively, become smaller than current amounts set by the first and second current sources, respectively;
   a second control circuit which controls, in a second operating range, a changing point at which the operating current provided to one of the third and fourth differential pairs changes, the second operating range being where amounts of currents flowing, based on the first and second input voltages and the output voltage, through the third and fourth differential pairs, respectively, become smaller than current amounts set by the third and fourth current sources, respectively; and
   an output amplification section which generates the output voltage based on a differential current output generated by combining the first and second pairs of differential currents outputted from the first current node pair and a differential current output generated by combining the third and fourth pairs of differential currents outputted from the second current node pair.

2. The differential amplifier according to claim 1, wherein the first and second input voltages are voltage signals equal to each other or differing from each other by a predetermined voltage value.

3. The differential amplifier according to claim 1,
   wherein, based on a steady-state characteristic with respect to changes in the first and second input voltages and with the first and second input voltages differing from each other by a predetermined voltage value, the first control circuit suppresses, by controlling an operating current flowing through the first differential pair in the first operating range, variation of a current difference between the differential currents outputted from the first current node pair; and
   wherein, based on a steady-state characteristic of changes with respect to the first and second input voltages and with the first and second input voltages differing from each other by a predetermined voltage value, the second control circuit suppresses, by controlling an operating current flowing through one of the third and fourth differential pairs in the second operating range, variation of a current difference between the differential currents outputted from the second current node pair.

4. The differential amplifier according to claim 1,
wherein the first control circuit includes a first resistor element coupled between the first current source and the first differential pair; and
wherein the second control circuit includes a second resistor element coupled between the third current source and the third differential pair or between the fourth current source and the fourth differential pair.

5. The differential amplifier according to claim 1,
wherein the first control circuit includes a first auxiliary transistor of the first conductivity type a first terminal of which is coupled to a coupling node coupling the first current source and the first differential pair, to a control terminal of which a first control voltage is inputted, and a second terminal of which is coupled to a first current supply terminal;
wherein the second control circuit includes a second auxiliary transistor of the second conductivity type, a first terminal of which is coupled to one of a coupling node coupling the third current source and the third differential pair and a coupling node coupling the fourth current source and the fourth differential pair, to a control terminal of which a second control voltage is inputted, and a second terminal of which is coupled to a second current supply terminal; and
wherein a current flowing between the first and second terminals of the first auxiliary transistor is controlled based on a difference between the first control voltage and a voltage at the first terminal of the first auxiliary transistor and a current flowing between the first and second terminals of the second auxiliary transistor is controlled based on a difference between the second control voltage and a voltage at the first terminal of the second auxiliary transistor.

6. The differential amplifier according to claim 1,
wherein each of the first and second differential pairs includes a transistor pair of the first conductivity type, the first terminals of the transistor pair being commonly coupled and the control terminals of the transistor pair forming an input pair; and
wherein each of the third and fourth differential pairs includes a transistor pair of the second conductivity type, the first terminals of the transistor pair being commonly coupled and the control terminals of the transistor pair forming an input pair.

7. The differential amplifier according to claim 1,
wherein the first differential pair includes first and second differential input transistors of the first conductivity type, the first differential pair receiving, at commonly coupled first terminals thereof, a current outputted from the first current source and being provided with, at control terminals thereof forming an input pair, the first input voltage and the output voltage;
wherein the second differential pair includes third and fourth differential input transistors of the first conductivity type, the second differential pair receiving, at commonly coupled first terminals thereof, a current outputted from the second current source and being provided with, at control terminals thereof forming an input pair, the second input voltage and the output voltage;
wherein the third differential pair includes fifth and sixth differential input transistors of the second conductivity type, the third differential pair receiving, at commonly coupled first terminals thereof, a current outputted from the third current source and being provided with, at control terminals thereof forming an input pair, the first input voltage and the output voltage;
wherein the fourth differential pair includes seventh and eighth differential input transistors of the second conductivity type, the fourth differential pair receiving, at commonly coupled first terminals thereof, a current outputted from the fourth current source and being provided with, at control terminals thereof forming an input pair, the second input voltage and the output voltage;
wherein second terminals of the first and third differential input transistors are commonly coupled to a first node of the first current node pair;
wherein second terminals of the second and fourth differential input transistors are commonly coupled to a second node of the first current node pair;
wherein second terminals of the fifth and seventh differential input transistors are commonly coupled to a first node of the second current node pair; and
wherein second terminals of the sixth and eighth differential input transistors are commonly coupled to a second node of the second current node pair.

8. The differential amplifier according to claim 1,
wherein the first differential pair includes first and second differential input transistors of the first conductivity type, the first differential pair receiving, at commonly coupled first terminals thereof, a current outputted from the first current source and being provided with, at control terminals thereof forming an input pair, the first input voltage and the output voltage;
wherein the second differential pair includes third and fourth differential input transistors of the first conductivity type, the second differential pair receiving, at commonly coupled first terminals thereof, a current outputted from the second current source and being provided with, at control terminals thereof forming an input pair, the second input voltage and the output voltage;
wherein the third differential pair includes fifth and sixth differential input transistors of the second conductivity type, the third differential pair receiving, at commonly coupled first terminals thereof, a current outputted from the third current source and being provided with, at control terminals thereof forming an input pair, the second input voltage and the output voltage;
wherein the fourth differential pair includes seventh and eighth differential input transistors of the second conductivity type, the fourth differential pair receiving, at commonly coupled first terminals thereof, a current outputted from the fourth current source and being provided with, at control terminals thereof forming an input pair, the first input voltage and the output voltage;
wherein second terminals of the first and third differential input transistors are commonly coupled to a first node of the first current node pair;
wherein second terminals of the second and fourth differential input transistors are commonly coupled to a second node of the first current node pair;
wherein second terminals of the fifth and seventh differential input transistors are commonly coupled to a first node of the second current node pair; and
wherein second terminals of the sixth and eighth differential input transistors are commonly coupled to a second node of the second current node pair.

9. The differential amplifier according to claim 1, wherein the output amplification section includes:
a first current mirror including a first transistor pair of the second conductivity type coupled to the second power supply and receiving the differential currents outputted from the first current node pair;

a second current mirror including a second transistor pair of the first conductivity type coupled to the first power supply and receiving the differential currents outputted from the second current node pair;

a first connection circuit coupled between an input node of the first current mirror and an input node of the second current mirror;

a second connection circuit coupled between an output node of the first current mirror and an output node of the second current mirror;

a first output transistor of the second conductivity type coupled between an output terminal outputting the output voltage and the second power supply and having a control terminal coupled to a coupling node coupling the output node of the first current mirror and a first end of the second connection circuit; and a second output transistor of the first conductivity type coupled between the output terminal and the first power supply and having a control terminal coupled to a second end of the second connection circuit.

10. The differential amplifier according to claim 9, wherein the first current mirror further includes a third transistor pair of the second conductivity type;

wherein the first transistor pair includes first and second mirror transistors first terminals of which are commonly coupled to the first power supply and control terminals of which are coupled to each other;

wherein the third transistor pair includes a third mirror transistor a first terminal of which is coupled to a second terminal of the first mirror transistor and a fourth mirror transistor a first terminal of which is coupled to a second terminal of the second mirror transistor and a control terminal of which is coupled to a control terminal of the third mirror transistor, the control terminal of which being applied with a first bias voltage;

wherein a second terminal of the third mirror transistor is coupled to control terminals of the first and second mirror transistors while serving as an input node for the first current mirror;

wherein a second terminal of the fourth mirror transistor serves as an output node for the first current mirror;

wherein the second node of the first current node pair is coupled to the second terminal of the first mirror transistor and the first node of the first current node pair is coupled to the second terminal of the second mirror transistor;

wherein the second current mirror further includes a fourth transistor pair of the first conductivity type;

wherein the second transistor pair includes fifth and sixth mirror transistors first terminals of which are commonly coupled to the second power supply and control terminals of which are coupled to each other;

wherein the fourth transistor pair includes a seventh mirror transistor a first terminal of which is coupled to a second terminal of the fifth mirror transistor and an eighth mirror transistor a first terminal of which is coupled to a second terminal of the sixth mirror transistor and a control terminal of which is coupled to a control terminal of the seventh mirror transistor, the control terminal of which being applied with a second bias voltage;

wherein a second terminal of the seventh mirror transistor is coupled to control terminals of the fifth and sixth mirror transistors while serving as an input node for the second current mirror;

wherein a second terminal of the eighth mirror transistor serves as an output node for the second current mirror; and wherein the second node of the second current node pair is coupled to the second terminal of the fifth mirror transistor and the first node of the second current node pair is coupled to the second terminal of the sixth mirror transistor.

11. The differential amplifier according to claim 9, wherein the first transistor pair includes first and second mirror transistors first terminals of which are commonly coupled to the second power supply and control terminals of which are coupled to each other;

wherein a second terminal of the first mirror transistor is coupled to a control terminal of the first mirror transistor and a control terminal of the second mirror transistor and serves as an input node for the first current mirror;

wherein a second terminal of the second mirror transistor serves as an output node for the first current mirror;

wherein a second node of the first current node pair is coupled to the second terminal of the first mirror transistor and a first node of the first current node pair is coupled to the second terminal of the second mirror transistor;

wherein the second transistor pair includes third and fourth mirror transistors first terminals of which are commonly coupled to the first power supply and control terminals of which are coupled to each other;

wherein a second terminal of the third mirror transistor is coupled to a control terminal of the third mirror transistor and a control terminal of the fourth mirror transistor and serves as an input node for the second current mirror;

wherein a second terminal of the fourth mirror transistor serves as an output node for the second current mirror; and wherein a second node of the second current node pair is coupled to a second terminal of the third mirror transistor and a first node of the second current node pair is coupled to a second terminal of the fourth mirror transistor.

12. The differential amplifier according to claim 9, wherein the first connection circuit includes a current source;

wherein the second connection circuit includes a first floating transistor of the first conductivity type and a second floating transistor of the second conductivity type, the first and second floating transistors being coupled in parallel;

wherein the first floating transistor is provided, at a control terminal thereof, with a third bias voltage; and wherein the second floating transistor is provided, at a control terminal thereof, with a four bias voltage.

13. A data driver comprising a differential amplifier group which includes a plurality of differential amplifiers according to claim 1.

* * * * *